US011508812B2

(12) United States Patent
Dasgupta et al.

(10) Patent No.: US 11,508,812 B2
(45) Date of Patent: Nov. 22, 2022

(54) MULTI-STEP LATERAL EPITAXIAL OVERGROWTH FOR LOW DEFECT DENSITY III-N FILMS

(71) Applicant: Intel Corporation, Santa Clara, CA (US)

(72) Inventors: Sansaptak Dasgupta, Hillsboro, OR (US); Han Wui Then, Portland, OR (US); Marko Radosavljevic, Portland, OR (US); Pavel M. Agababov, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 81 days.

(21) Appl. No.: 16/643,446

(22) PCT Filed: Sep. 29, 2017

(86) PCT No.: PCT/US2017/054579
§ 371 (c)(1),
(2) Date: Feb. 28, 2020

(87) PCT Pub. No.: WO2019/066955
PCT Pub. Date: Apr. 4, 2019

(65) Prior Publication Data
US 2020/0194549 A1      Jun. 18, 2020

(51) Int. Cl.
*H01L 29/06* (2006.01)
*H01L 29/778* (2006.01)
*H01L 21/02* (2006.01)

(52) U.S. Cl.
CPC ...... *H01L 29/0657* (2013.01); *H01L 21/0254* (2013.01); *H01L 21/02458* (2013.01);
(Continued)

(58) Field of Classification Search
CPC ......... H01L 21/02433; H01L 21/02458; H01L 21/02488; H01L 21/0254; H01L 21/02639;
(Continued)

(56) References Cited

U.S. PATENT DOCUMENTS 9,153,645 B2 *  10/2015  Li .......................... H01L 31/036
9,397,099 B1 *   7/2016  Huang ............ H01L 21/823431
(Continued)

FOREIGN PATENT DOCUMENTS

WO         2015120118          8/2015

OTHER PUBLICATIONS

International Search Report and Written Opinion for International Patent Application No. PCT/US2017/054579, dated Jun. 28, 2018.
(Continued)

*Primary Examiner* — Duy T Nguyen
(74) *Attorney, Agent, or Firm* — Essential Patents Group, LLP

(57) ABSTRACT

Techniques related to forming low defect density III-N films, device structures, and systems incorporating such films are discussed. Such techniques include epitaxially growing a first crystalline III-N structure within an opening of a first dielectric layer and extending onto the first dielectric layer, forming a second dielectric layer over the first dielectric layer and laterally adjacent to a portion of the first structure, and epitaxially growing a second crystalline III-N structure extending laterally onto a region of the second dielectric layer.

19 Claims, 16 Drawing Sheets

(52) U.S. Cl.
CPC .. *H01L 21/02488* (2013.01); *H01L 21/02647* (2013.01); *H01L 29/778* (2013.01); *H01L 21/02433* (2013.01)

(58) Field of Classification Search
CPC ......... H01L 21/02642; H01L 21/02647; H01L 29/0646; H01L 29/0649; H01L 29/0657; H01L 29/2003; H01L 29/66204; H01L 29/66462; H01L 29/778; H01L 29/7788; H01L 29/8613
USPC .......................................................... 257/618
See application file for complete search history.

(56) References Cited

U.S. PATENT DOCUMENTS

| | | |
|---|---|---|
| 2006/0175621 A1 | 8/2006 | Ohtsuka et al. |
| 2006/0258027 A1 | 11/2006 | Ohmae et al. |
| 2009/0309110 A1 | 12/2009 | Raring et al. |
| 2010/0140745 A1* | 6/2010 | Khan ................ H01L 21/02647 257/615 |
| 2013/0140525 A1* | 6/2013 | Chen ................ H01L 21/02507 257/22 |
| 2014/0162438 A1 | 6/2014 | Lochtefeld |
| 2014/0264380 A1 | 9/2014 | Kub et al. |
| 2015/0206796 A1* | 7/2015 | Dasgupta .......... H01L 21/76229 257/76 |
| 2016/0027868 A1 | 1/2016 | Chan et al. |
| 2016/0365435 A1* | 12/2016 | Then ................ H01L 29/66446 |
| 2017/0170093 A1 | 6/2017 | Maples et al. |

OTHER PUBLICATIONS

International Preliminary Report on Patentability from PCT/US2017/054579 dated Apr. 9, 2020, 12 pgs.

* cited by examiner

MULTI-STEP LATERAL EPITAXIAL OVERGROWTH FOR LOW DEFECT DENSITY III-N FILMS

CLAIM OF PRIORITY

This Application is a National Stage Entry of, and claims priority to, PCT Application No. PCT/US2017/054579, filed on Sep. 29, 2017 and titled "MULTI-STEP LATERAL EPITAXIAL OVERGROWTH FOR LOW DEFECT DENSITY III-N FILMS", which is incorporated by reference in its entirety for all purposes.

BACKGROUND

Many advanced semiconductor devices in development leverage non-silicon semiconductor materials, including III-N materials, as well as other materials with wurtzite crystallinity, which show particular promise for high voltage and high frequency applications such as power management integrated circuits (PMICs) and radio frequency (RF) power amplifiers. However, to fabricate such devices, low defect density III-N films are needed. Current techniques for forming such films, such as high vacuum plasma-assisted chemical vapor deposition, are difficult, time consuming, require extremely thick films to reach low defect density, and are prohibitively expensive for the production of consumer devices.

As such, existing techniques do not provide for low defect density III-N films that are manufacture ready. Such problems may become critical as the desire to implement III-N devices such as high voltage diodes and transistors in PMICs, radio frequency integrated circuits (RFICs), as well as in other applications that may utilize III-N films becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
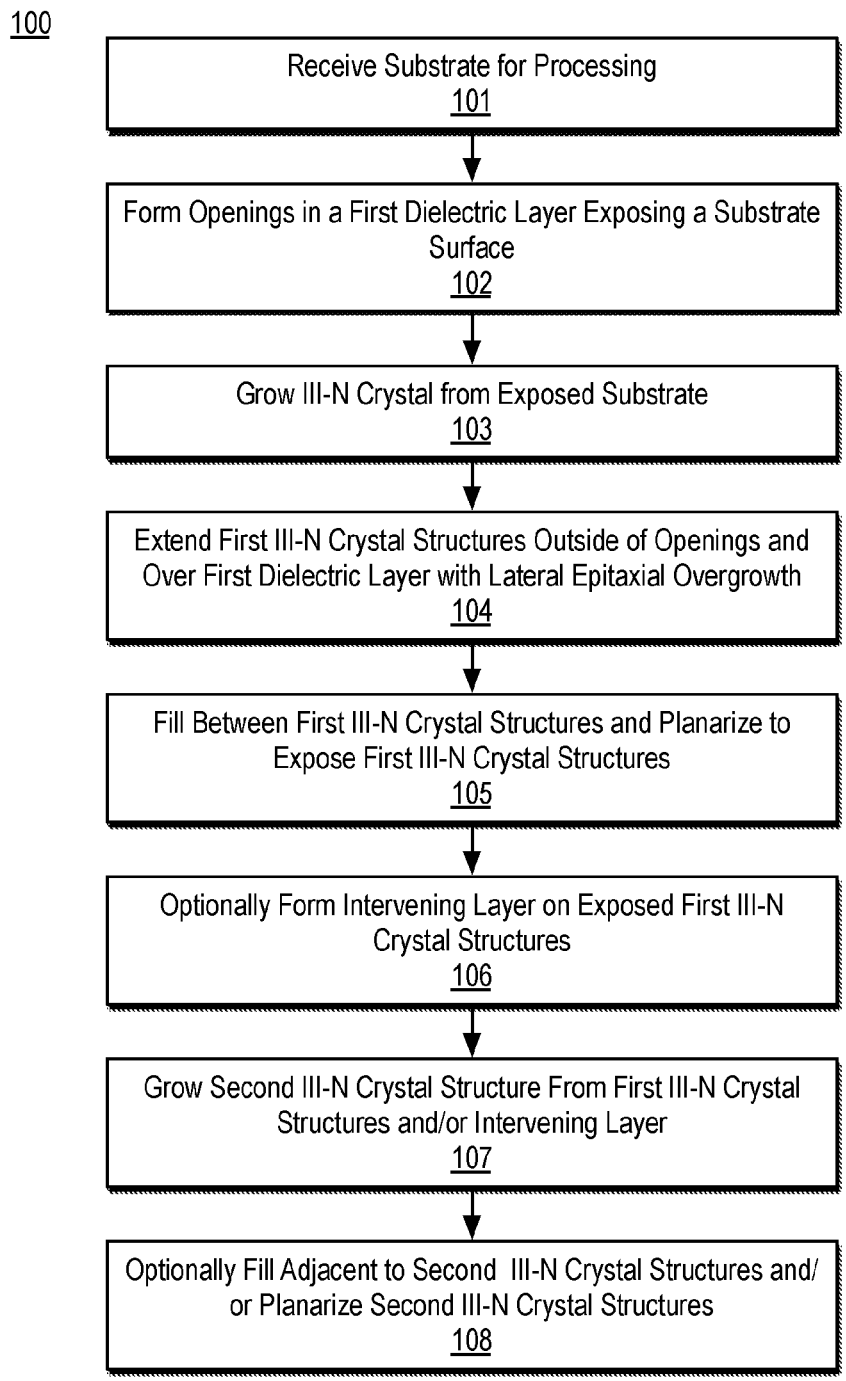
FIG. 1 is a flow diagram illustrating methods for forming semiconductor device structures with a low defect density III-N film.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Semiconductor device structures, devices, apparatuses, computing platforms, and methods are described below related to multi-step lateral epitaxial overgrowth for forming III-N layers or films.

As described above, it may be advantageous to provide improved III-N films and/or improved techniques for forming such films. In an embodiment, a first crystalline III-N semiconductor structure is epitaxially grown on a substrate from within an opening of a first dielectric layer (e.g., an amorphous dielectric layer) such that the structure is partially within the opening and partially extending over the opening and laterally onto the dielectric layer adjacent to the opening. For example, the first crystalline III-N semiconductor structure includes a first portion within the opening and a second portion extending over the opening and laterally onto a region of the first dielectric layer adjacent to the opening. A second dielectric layer (e.g., an amorphous dielectric layer) is formed or disposed over the dielectric layer and adjacent to the portion of the first crystalline III-N semiconductor structure extending over the opening and laterally onto the region of the first dielectric layer (e.g., adjacent to the second portion). For example, the second dielectric layer may be blanket deposited and a planar operation may be performed to form the second dielectric layer and expose the first crystalline III-N semiconductor structure. A second crystalline III-N semiconductor structure is epitaxially grown from the exposed first crystalline III-N semiconductor structure or from an intervening layer formed on the first crystalline III-N semiconductor structure such that the second crystalline III-N semiconductor structure extends laterally onto a region of the second dielectric layer that is over the region of the first dielectric layer.

Such techniques provide a multilevel crystalline III-N semiconductor structure having a first structure or portion within an opening in an amorphous dielectric layer and extending over the opening and laterally onto the amorphous dielectric layer and a second structure or portion over the first structure or portion and extending onto a second amorphous dielectric layer adjacent to the lateral overgrowth portion of the first structure or portion. As used herein, the term crystalline III-N semiconductor structure or simply the term structure indicates a separate structure or portion or segment of a larger structure such as a multilevel structure. In some embodiments, two or more crystalline III-N semiconductor structures may be continuous crystals that form a larger structure. Such crystalline III-N semiconductor structures may be characterized as portions, segments, or the like, of a larger crystalline III-N semiconductor structure such as a multilevel crystalline III-N semiconductor structure.

FIG. 1 is a flow diagram illustrating methods 100 for forming semiconductor device structures with a low defect density III-N film, arranged in accordance with at least some implementations of the present disclosure. FIGS. 2, 3, 4, 5, 6, 7, 8, 9, 10, 11, 12, 13, 14, 15 and 16 are cross-sectional views of exemplary semiconductor device structures as selected fabrication operations in the methods 100 are performed, in accordance with some embodiments.

Figure 2:
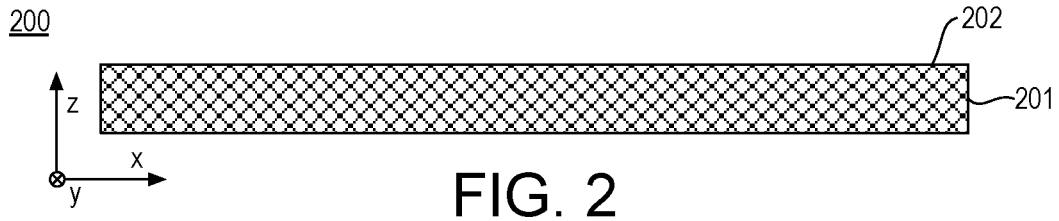
FIGS. 2, 3, 4, 5, 6, 7, 8, 9, 10, 11, 12, 13, 14, 15 and 16 are cross-sectional views of exemplary semiconductor device structures as selected fabrication operations in the methods of FIG. 1 are performed.

As shown in FIG. 1, methods 100 begin at operation 101, where a substrate is received for processing. The substrate may be received for processing using any suitable technique or techniques. FIG. 2 illustrates an example semiconductor device structure 200 including an example substrate 201. Substrate 201 may include any suitable material or materials. For example, substrate 101 may be a substrate substantially aligned along a predetermined crystal orientation (e.g., (100), (111), (110), or the like). In some examples, substrate 201 may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. In some examples, substrate 201 may include silicon having a (100) crystal orientation with a 4°-11° miscut (with 4°-6° being particularly advantageous). Examples using silicon having a crystal orientation of (110) or (111) may offer the advantage of having a smaller mismatch for subsequent epitaxial growth. For example, substrate 201 may be (111) silicon, (100) silicon, or (110) silicon. In an embodiment, substrate 201 includes a (111) crystalline group IV material. In various examples, substrate 201 may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like.

As shown, substrate 201 may be oriented such that a surface 202 (e.g., a top surface) thereof is substantially planar with respect to an x-y plane and orthogonal with respect to a z axis. In some embodiments, surface 202 may be characterized as or surface 202 may include a crystalline seeding surface. The crystalline seeding surface may be a surface of a bulk material of substrate 201 or of some interfacial material of substrate 201 formed on substrate 201. For example, surface 202 may include a nucleation layer such as a layer of AlN for the growth of GaN as is discussed further herein below. Such a nucleation layer may be provided on an entirety of substrate 201 as illustrated in the example of FIG. 1 or a nucleation layer may be provided within openings of a dielectric material as discussed with respect to FIG. 4.

Figure 3:
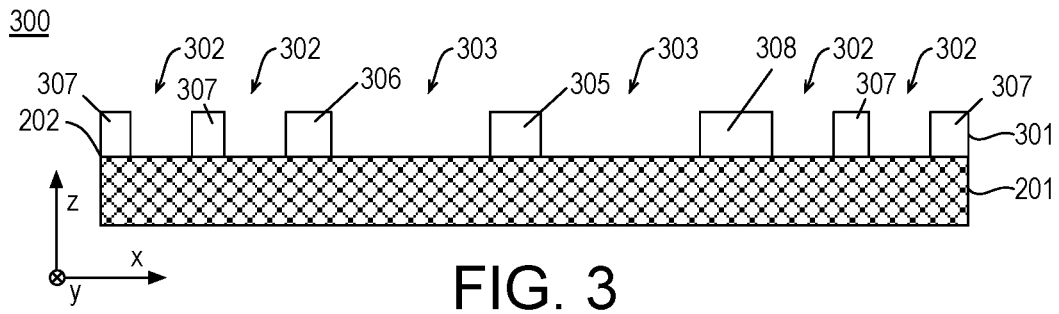

Returning to FIG. 1, methods 100 continue at operation 102, where one or more openings are formed in a first dielectric layer to expose a surface of the substrate within the opening(s). The dielectric layer and the openings therein may be formed using any suitable technique or techniques. In an embodiment, the dielectric layer is deposited with any technique known to be suitable for the material and the dielectric layer is subsequently patterned using lithography and etch operations. FIG. 3 illustrates an example semiconductor device structure 300 similar to semiconductor device structure 200, after the formation of a dielectric layer 301 having openings such as openings 302, 303 formed therein. Dielectric layer 301 may include any suitable material or materials. For example, dielectric layer 301 may be alumina ($Al_2O_3$), silica (SiO), silicon nitrides (SiN), silicon oxynitrides (SiON), or silicon carbonitrides (SiCN). In some embodiments, dielectric layer 301 is an amorphous layer and dielectric layer 301 may be characterized as an amorphous layer, a patterned layer, or simply a layer. Dielectric layer 301 may have any suitable thickness (i.e., in the z-direction) such as a thickness in the range of 100 to 500 nm.

As shown, openings 302, 303 expose flat regions of surface 202 of varying lateral widths (i.e., along the x-direction) and, optionally, longitudinal lengths (i.e., along the y-direction). Openings 302, 303 may have any suitable lateral widths and longitudinal lengths to effectuate the subsequent epitaxial growth structures discussed herein. For example, openings 302 have lateral widths that are less than the lateral widths of openings 303. In an embodiment, openings 303, which will be used to form crystalline III-N structures that overgrow regions of dielectric layer 301 adjacent to openings 303, have a lateral width (i.e., in the x-direction) in the range of 5 to 10 um. In an embodiment, openings 303, have a lateral width in the range of 10 to 20 um. In an embodiment, openings 302, which will be used to form crystalline III-N dummy structures, have a lateral width (i.e., in the x-direction) in the range of 200 to 300 nm. In an embodiment, openings 302 have a lateral width in the range of 300 to 500 nm. Openings 302, 303 may have any suitable longitudinal length (i.e., in the y-direction) that is greater than the lateral width thereof in an embodiment, openings 302, 303 have a longitudinal length (i.e., in the y-direction) in the range of 20 to 30 um. In an embodiment, openings 302, 303 have a longitudinal length in the range of 30 to 50 um. In an embodiment, openings 302 have a lateral width of about 300 nm and a longitudinal length of about 50 um and openings 303 have a lateral width of about 5 um and a longitudinal length of about 50 um. Furthermore, as discussed, dielectric layer 301 may have any suitable thickness such as a thickness in the range of 100 to 500 nm and openings 302, 303 may, thereby, have the same or substantially similar heights (i.e., in the z-direction) such as heights in the range of 100 to 500 nm.

Openings 302, 303 may be separated by portions of dielectric layer 301 such as portions 305, 306, 307, 308 having any suitable lateral widths (i.e., in the x-direction). In an embodiment, portion 305 of dielectric layer 301, which is a portion that will separate adjacent crystalline III-N structures having overgrowth has a lateral width in the range of 500 um to 2 um. In an embodiment, portions 306, 308 of dielectric layer 301, which are portions that will separate crystalline III-N structures having overgrowth from adjacent dummy structures have lateral widths in the range of 500 nm to 2 um. In an embodiment, portions 307 of dielectric layer 301, which will separate adjacent dummy structures have lateral widths in the range of 500 to 1 um. Furthermore, such portions, 306, 308 may have different lateral widths, as illustrated, or they may be substantially the same. Similarity, portions 307 may have the same or different lateral widths. As discussed, openings 302, 303 are formed or patterned in dielectric layer 301. Openings 302, 302 may be characterized as gaps, trenches, or the like.

Returning to FIG. 1, methods 100 continue at operations 103 and 104, where III-N crystal structures are epitaxially grown from the exposed substrate surfaces within the opening(s) formed at operation 102. The III-N crystal structures may be epitaxially grown using any suitable technique or techniques. For example, the III-N crystals or crystal structures may be epitaxially grown from crystalline seeding surfaces unprotected by the dielectric layer formed at operation 102. In some embodiments, operation 103 includes deposition of a seed layer (e.g., AlN) of any suitable thickness such as a thickness in the range of 50 to 100 nm. In some embodiments, operation 103 further implements first epitaxial GaN growth conditions (e.g., a first GaN growth pressure, a first GaN growth temperature, and a first V/III growth precursor ratio). Following an initial growth period, growth conditions may be changed at operation 104 to a second GaN growth temperature, and/or a second V/III growth precursor ratio favoring lateral epitaxial overgrowth (LEO) of GaN to extend at least some GaN crystal structures over their openings and onto a top surface of the dielectric material. The crystal growth may be performed using any known technique, such as, but not limited to, metal-organic chemical vapor deposition (MOCVD), vapor phase epitaxy (VPE), hydride vapor phase epitaxy (HVPE), or molecular beam epitaxy (MBE). In some embodiments, elevated temperatures of 900° C., or more, are employed at operation 104 to epitaxially grow a GaN crystalline structure. Although illustrated as separate operations, in some embodiments, operations 103, 104 may be performed together.

Figure 4:
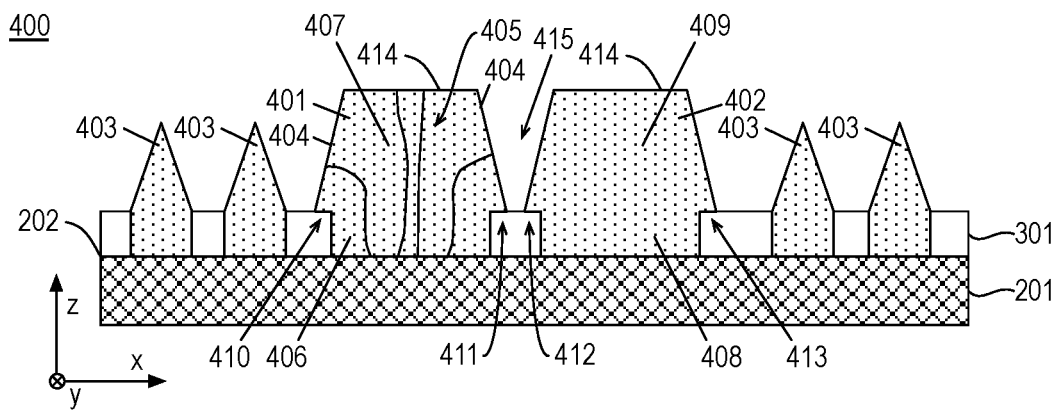

FIG. 4 illustrates an example semiconductor device structure 400 similar to semiconductor device structure 300, after the epitaxial growth of III-N crystal structures 401, 402 and III-N crystal dummy structures 403. III-N crystal structures 401, 402 and III-N crystal dummy structures 403 may include any suitable crystalline III-N materials. In some embodiments, III-N crystal structures 401, 402 and III-N crystal dummy structures 403 are a III-N material, such as, but not limited to AlN, GaN, AlGaN, or InAlGaN. In some embodiments, III-N crystal structures 401, 402 and III-N crystal dummy structures 403 are the same III-N material. For example, III-N crystal structures 401, 402 and III-N crystal dummy structures 403 may be GaN. Although structures and techniques are described in detail in the context of exemplary III-N materials and, in particular, GaN materials, they may be more generally applicable to any III-N materials (e.g., AlN, GaN, AlGaN, or InAlGaN) or to the family of wurtzite semiconductors further including at least AgI, ZnO, CdS, CdSe, α-SiC, and BN, and may also be further applicable to other non-silicon material systems, such as, but not limited to GaAs, InP, InAs, InGaAs, InGaP, etc. Hence, one of skill in the art familiar with the characteristics of these alternate semiconductor material systems will may successfully apply the techniques described herein absent some specific knowledge of a salient incompatibility between the exemplary III-N material system described in detail herein and the alternate material system.

As shown in FIG. 4, III-N crystal structure 401 and III-N crystal structure 402 have portions that fill their corresponding openings 303 (please refer to FIG. 3) and portions that extend over the openings (i.e., in the z-direction) and laterally (i.e., in the xdirection) onto regions of dielectric layer 301. For example, III-N crystal structure 401 includes a portion 406 within its opening and a portion 407 that extends above the opening and onto region 410 of dielectric layer 301 and region 411 of dielectric layer 301. Similarly, III-N crystal structure 402 includes a portion 408 within its opening and a portion 409 that extends above the opening and onto region 412 of dielectric layer 301 and region 413 of dielectric layer 301. III-N crystal structure 401 and III-N crystal structure 402 may overgrow onto regions 410, 411, 412, 413, by any suitable amount. For example, regions 410, 411, 412, 413 may have a width (i.e., in the x-direction) in the range of 50 to 300 nm. III-N crystal structure 401 and III-N crystal structure 402 may have any suitable heights (i.e., in the z-direction extending from top surface 202 to top surfaces 414 of III-N crystal structures 401, 402) such as a height in the range of 500 nm to 5 um. As shown, in some embodiments, dummy structures 403 extend above their openings but they do not extend laterally onto regions of dielectric layer 301. In other embodiments, dummy structures 403 extend laterally onto regions of dielectric layer 301. Furthermore, in the illustrated embodiment, dummy structures 403 are shorter than III-N crystal structures 401, 402 due to being grown from narrower openings and exhaustion of the c-plane along the z-axis. In other embodiments, as discussed further below, dummy structures 403 may have substantially the same height as III-N crystal structures 401, 402. As discussed, dummy structures 403 may continue to grow laterally, however such growth is essentially self terminating as the c-plane is exhausted.

Furthermore, as shown with respect to III-N crystal structure 401, III-N crystal structures 401, 402 and III-N crystal dummy structures 403 may include defects 405 (e.g., glide defects). As shown, in some embodiments, the LEO process employed at operation 103 favors formation of sloped sidewall facets as illustrated with respect to sidewalls 404 of III-N crystal structure 401, which may be at an angle of about 60° with respect to the x-y plane. For example, sidewalls 404 extend along the longitudinal length of III-N crystal structure 401 (i.e., along the v-direction) and sidewalls 404 slope from outer edges of regions 410, 411 at a base of portion 407 inwardly toward top 414 of III-N crystal structure 401. Sidewalls of III-N crystal structure 402 and dummy structures 403 have similar profiles. Such sloped sidewalk bend defects away from the c-plane (e.g., which is substantially along the z-axis) and toward the sidewalls due to energy minimization by the defects such that a quality of top surfaces 414 of III-N crystal structures 401, 402 are improved. However, as shown, defects toward a centerline of III-N crystal structure 401 continue to thread toward top surface 414 of III-N crystal structure 401 due to the nature of the III-N wurtzite crystal of III-N crystal structure 401. III-N crystal structure 402 may include similar defects, which are not illustrated for the sake of clarity of presentation. As shown, upon termination of operation 103, III-N crystal structures 401, 402 have portions 407, 409 with trapezoidal profiles (i.e., when taken in cross-section along the x-z plane). In some embodiments, III-N crystal growth during operation 103 includes no intentional in-situ impurity doping. In the illustrated embodiment, a gap 415 is provided between III-N crystal structures 401, 402 such that III-N crystal structures 401, 402 are separated laterally (i.e., in the x-direction) along a longitudinal distance (i.e., in they direction) of III-N crystal structures 401, 402. In other embodiments, III-N crystal structures 401, 402 may at least partially merge as is illustrated with respect to FIG. 17 and elsewhere herein.

Returning to FIG. 1, methods 100 continue at operation 105 where gaps between the III-N crystal structures are filled with a dielectric material and the III-N crystal structures and the dielectric material are planarized to expose the III-N crystal structures. For example, operation 105 may include a gap-filling dielectric deposition process. In an embodiment, a flowable oxide deposition (PECVD and/or spin-on) process may be employed to backfill the III-N crystal structures with an electrically insulating dielectric (e.g., $SiO_2$, SiON, SiOCN, SiOC(H)). In an embodiment, a nitride deposition (PECVD) process may be employed to backfill the III-N crystal structures with an electrically insulating dielectric (e.g., SiN). Operation 105 may then include chemical-mechanical polishing of the gap-filling dielectric, stopping on a top surface of the III-N crystal structures.

Figure 5:
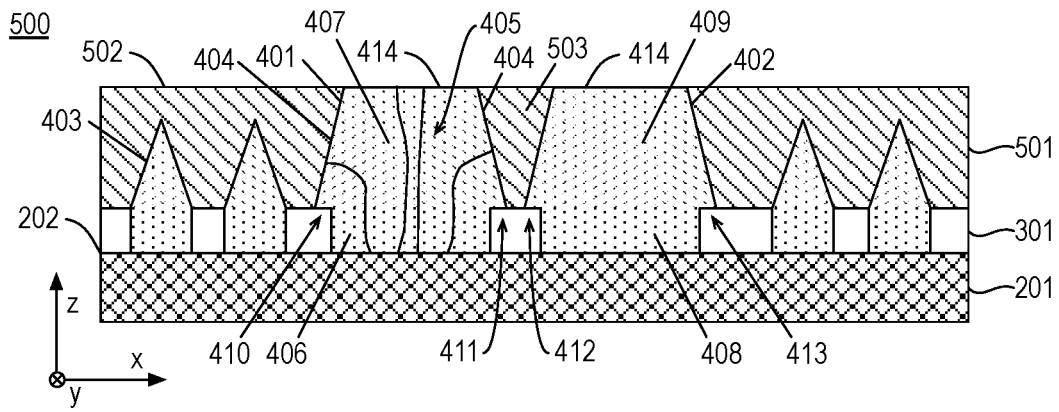

FIG. 5 illustrates an example semiconductor device structure 500 similar to semiconductor device structure 400, after the formation of dielectric layer 501 on exposed regions of dielectric layer 301 and laterally adjacent to portions 407, 409 of crystal structures 401, 402, respectively. Dielectric layer 501 may include any suitable material such as SiN, $SiO_2$, SiON, SiOCN, SiOC(H), as discussed. Furthermore, as shown in FIG. 5, dielectric layer 501, after planarization, is on or over previously exposed portions of dielectric layer 301 and laterally adjacent to portion 407 of III-N crystal structure 401. For example, as illustrated with respect to sidewalls 404 of III-N crystal structures 401, dielectric layer 501 may be adjacent to or on an entirety of sidewalls 404 of III-N crystal structures 401. Similarly, dielectric layer 501 may be adjacent to or on an entirety of the sidewalls of III-N crystal structures 401. Furthermore, in the illustrated embodiment, dielectric layer 501 covers dummy structures 403 such that no portion of dummy structures 403 are exposed. In other embodiments, dielectric layer 501 exposes a portion or top surface of dummy structures 403 as illustrated with respect to FIG. 11 and elsewhere herein. Also as shown, top surface 502 is substantially planar (i.e., along the x-y plane) with top surfaces 414 of III-N crystal structures 401, 402. As shown, in an embodiment, III-N crystal structures 401, 402 are entirely separated by a portion 503 of dielectric layer 501. In other embodiments, III-N crystal structures 401, 402 may merge.

Returning to FIG. 1, methods 100 optionally continue at operation 106, where an intervening layer may be formed on exposed portions of the III-N crystal structures exposed at operation 105. Such techniques will be discussed further herein below. As shown, methods 100 may continue from operation 105 or operation 106 at operation 107, where second III-N crystal structures are epitaxially grown from the exposed portions of the III-N crystal structures exposed at operation 105 and/or from the intervening layer formed at operation 106. Discussion of methods 100 continues with an embodiment where no intervening layer is provided with discussion of the intervening layer being provided herein below.

The III-N crystal structures (e.g., second crystal structures) may be epitaxially grown at operation 107 using any suitable technique or techniques. For example, the III-N crystals or crystal structures may be epitaxially grown from the exposed crystalline surfaces of the previously formed III-N crystal structures. In some embodiments, operation 107 implements first epitaxial GaN growth conditions followed by growth conditions favoring lateral epitaxial overgrowth (LEO) of GaN, as discussed with respect to operation 103, to extend at least some GaN crystal structures onto a top surface of the dielectric fill material provided at operation 105. The crystal growth may be performed using any known technique, such as, but not limited to, metal-organic chemical vapor deposition (MOCVD), vapor phase epitaxy (VPE), hydride vapor phase epitaxy (HVPE), or molecular beam epitaxy (MBE). In some embodiments, elevated temperatures of 900° C., or more, are employed at operation 104 to epitaxially grow a GaN crystalline structure.

Such a second step or stage of III-N crystal growth (e.g., with operations 103, 104 providing a first step or stage of III-N crystal growth) advantageously provides for reduced defect density in the second III-N crystal structures due to defects bending toward sidewalls of the second III-N crystal structures as well as defects annihilating one another over the thickness of the second III-N crystal structures. Furthermore, due to the reduced density of III-N crystal material at the top surface (e.g., as dummy structures have been covered by a gap filling dielectric and as the gap filling dielectric only exposes the top surfaces of the underlying III-N crystal structures) from which to grow, local growth rates of the III-N material are substantially increased. For example, GaN MOCVD growth rates of over 300 um/hour may be achieved. For example, since Ga flux may be a limiting factor in GaN growth, particularly in MOCVD implementations, the reduced surface area of exposed underlying III-N crystal structures (e.g., over only about 10% of the surface of substrate 201) may increase the incorporation of Ga into GaN growth to achieve such growth rates.

Figure 6:
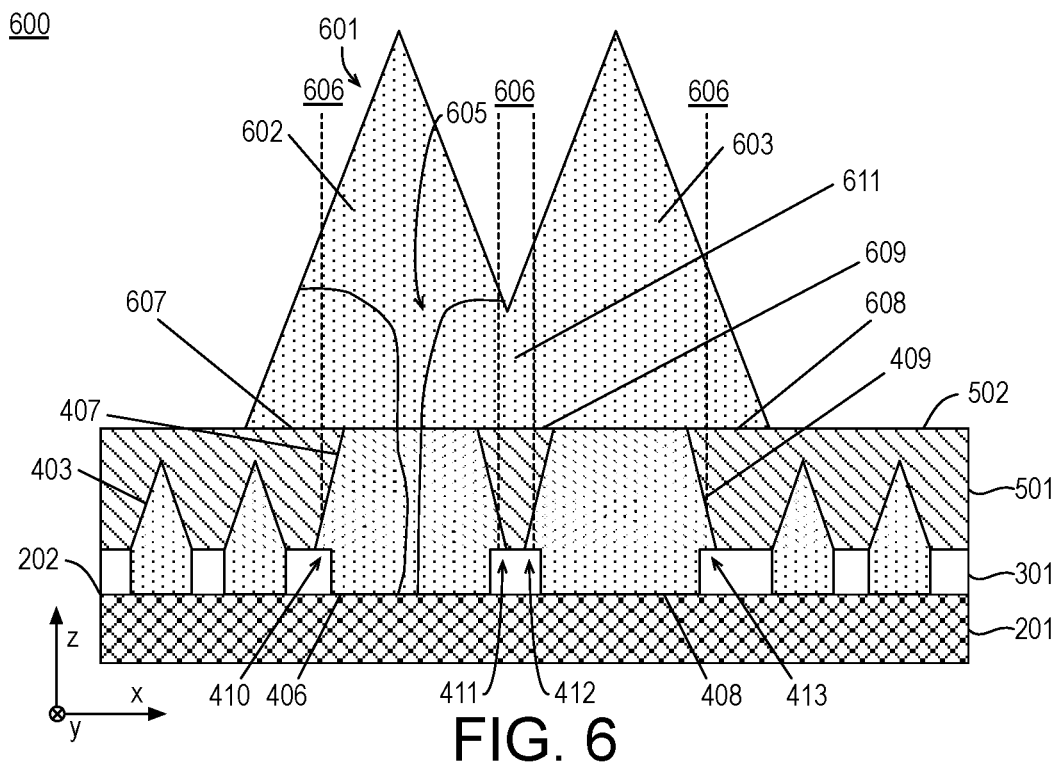

FIG. 6 illustrates an example semiconductor device structure 600 similar to semiconductor device structure 500, after the epitaxial growth of III-N crystal structure 601. III-N crystal structure 601 may include any suitable crystalline III-N materials or alternative wurtzite semiconductor materials discussed herein. In an embodiment, III-N crystal structure 601 has the same composition as III-N crystal structures 401, 402. In other embodiments, III-N crystal structure 601 has a different composition with respect to III-N crystal structures 401, 402. In an embodiment, III-N crystal structures 401, 402 are undoped GaN and III-N crystal structure 601 is doped GaN (e.g., in situ Si n-doped or in situ Mg p-doped). As shown, in an embodiment, III-N crystal structure 601 includes a portion 602 on or over III-N crystal structure 401 and a portion 603 on or over III-N crystal structure 402 such that portion 602 and portion 603 have merged in region 611.

As shown in FIG. 6, III-N crystal structure 601 extends laterally onto regions of dielectric layer 501. For example, III-N crystal structure 601 includes a portion that extends onto overgrowth region 607 of dielectric layer 501, a portion that extends onto overgrowth region 608 of dielectric layer 501, and a portion that extends onto region 609 of dielectric layer 501. Furthermore, as shown with respect to vertical lines 606, overgrowth region 607 is over region 410, region 609 is over regions 411, 412, and overgrowth region 608 is over region 413. That is, at least a portion of each region of dielectric layer 501 that a portion of III-N crystal structure 601 extends onto is directly over (e.g., in line with one another with respect to a line orthogonal to surface 202 of substrate 201 or, similarly, in line with one another with respect to the z-direction) one or more regions of dielectric layer over which a portion of one of III-N crystal structures 401, 402 extends onto. Therefore, III-N crystal structure 601 and III-N crystal structures 401, 402 provide a multilayer structure including portions or substructures that each extend laterally onto a corresponding dielectric layer. As shown, in some embodiments, portions of such lateral extensions are in line vertically (e.g., over one another).

Furthermore, as shown with respect to portion 602 of III-N crystal structure 601, crystal structure 601 may include defects 605 that continue defects from III-N crystal structures 401, 402 (as shown) and/or originate with the second epitaxial growth. As shown, in some embodiments, the LEO process employed at operation 107 favors formation of sloped sidewall facets as discussed above, which may bend defects away from the c-plane (e.g., which is substantially along the z-axis) and toward the sidewalls. III-N crystal structure 601 may have any suitable height (i.e., in the z-direction extending from top surface 502 to a top apex of III-N crystal structure 601) such as a height in the range of 10 to 15 um.

Figure 7:
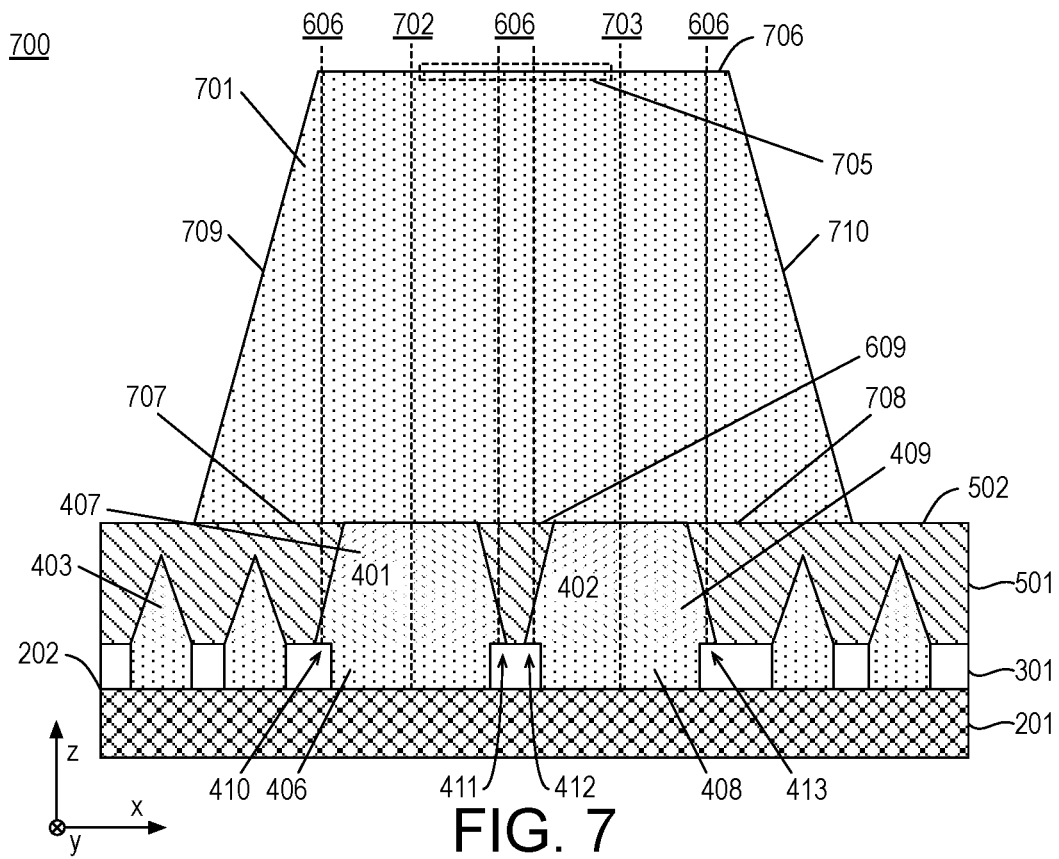

FIG. 7 illustrates an example semiconductor device structure 700 similar to semiconductor device structure 600, after the continued epitaxial growth of III-N crystal structure 601 to form III-N crystal structure 701. For example, the continued epitaxial growth of III-N crystal structure 601 allows portions 602, 603 (e.g., individual pyramid structures) to merge to form III-N crystal structure 701 having a substantially trapezoidal cross-section (i.e., as taken along the x-z plane). III-N crystal structure 701 includes any suitable crystalline III-N materials as discussed with respect to crystal structure 701. As shown in FIG. 7, III-N crystal structure 701 extends laterally onto regions of dielectric layer 501 and in some areas, such as overgrowth regions 707, 708, III-N crystal structure 701 extends further onto such regions with respect to III-N crystal structure 601. As discussed with respect to III-N crystal structure 601, III-N crystal structure 701 includes a portion that extends onto overgrowth region 707 of dielectric layer 501, a portion that extends onto overgrowth region 708 of dielectric layer 501, and a portion that extends onto region 609 of dielectric layer 501 such that, as shown with respect to vertical lines 606, overgrowth region 707 is over region 410, region 609 is over regions 411, 412, and overgrowth region 708 is over region 413. That is, at least a portion of each region of dielectric layer 501 that a portion of III-N crystal structure 701 extends onto is directly over (e.g., in line with one another with respect to a line orthogonal to surface 202 of substrate 201 or, similarly, in line with one another with respect to the z-direction) one or more regions of dielectric layer over which a portion of one of III-N crystal structures 401, 402 extends onto. Therefore, III-N crystal structure 701 and III-N crystal structures 401, 402 provide a multilayer structure including portions or substructures that each extend laterally onto a corresponding dielectric layer. As shown, in some embodiments, portions of such lateral extensions are in line vertically (e.g., over one another).

Furthermore, as discussed with respect to portion 602 of III-N crystal structure 601, III-N crystal structure 701 may include defects (not shown in FIG. 7) that have terminated within III-N crystal structure 701 and or at sidewall 709 or sidewall 710 of III-N crystal structure 701. The discussed multi-step or stage III-N crystal growth advantageously provides for reduced defect density at top surface 706 of III-N crystal structure 701. As discussed, such defect densities may be reduced by providing increased sidewall defect termination opportunities as well as increased thickness of III-N crystalline materials. For example, defect densities of not more than 1e8 defects/cm$^2$, not more than 1e7 defects/cm$^2$, or not more than 1e6 defects/cm$^2$ may be achieved at top surface 706 (i.e., opposite substrate 201) of III-N crystal structure 701 depending on processing conditions and the thickness of III-N crystal structure 701 and III-N crystal structures 401, 402. III-N crystal structure 701 may have any suitable height or thickness (i.e., in the z-direction extending from top surface 502 to top surface 706). In an embodiment, III-N crystal structure 701 has a height or thickness in the range of 10 to 15 um. In an embodiment, III-N crystal structure 701 has a height or thickness in the range of 15 to 40 um. In an embodiment, III-N crystal structure 701 has a height or thickness in the range of 40 to 80 um or more.

As discussed, in some embodiments, the LEO process employed at operation 107 favors formation of sloped sidewall facets as illustrated with respect to sidewalls 709, 710 of III-N crystal structure 701 which may be at an angle of about 60° with respect to the x-y plane. For example, sidewalls 709, 710 extend along the longitudinal length of III-N crystal structure 701 (i.e., along the y-direction) and sidewalls 709, 710 slope from outer edges of overgrowth regions 707, 708 at a base of III-N crystal structure 701 inwardly toward a centerline of top surface 706 of III-N crystal structure 701.

Top surface 706 of III-N crystal structure 701 thereby provides a high quality low defect density III-N crystalline surface on which and/or within which any suitable device may be disposed, formed or fabricated. In an embodiment, a high breakdown voltage diode may be formed on and/or within III-N crystal structure 701 as discussed with respect to FIGS. 16-20. In an embodiment, a high breakdown voltage diode may be formed on and/or within III-N crystal structure 701 as discussed with respect to FIGS. 21-28. However any suitable device may be formed on and/or within III-N crystal structure 701.

Furthermore, as illustrated with respect to region 705 of III-N crystal structure 701 opposite substrate 201, in some embodiments, a device or devices or particular types of device(s) may be formed only within region 705. For example, as discussed, some defects within III-N crystal structures 401, 402 and/or portions 602, 603 of III-N crystal structure 601 may propagate along centerlines 702, 703 thereof such that the centerline defects or those defects within a threshold lateral distance of such a centerline (e.g., 50 to 200 nm) may terminate along sidewalls less frequently than those nearer the edges. Although such centerline defects may annihilate one another during the discussed epitaxial growths, larger defect densities may still exist at or near centerlines 702, 703. In some embodiments, defect density sensitive devices may be formed only on or within region 705 and/or only on or within regions laterally external with respect to centerlines 702, 703 (e.g., in regions, not shown, extending from centerlines 702, 703 laterally outwardly therefrom). Although illustrated with respect to III-N crystal structure 701 being grown from two underlying III-N crystal structures 401, 402, III-N crystal structure 701 and any other higher level III-N crystal structure discussed herein may be grown from any number of underlying III-N crystal structures such as three or four underlying III-N crystal structures.

Returning to FIG. 1, methods 100 may continue at operation 108 where gaps between the III-N crystal structures may be filled with a dielectric material and the III-N crystal structures and the dielectric material are planarized to expose the III-N crystal structures. For example, operation 108 may include a gap-filling dielectric deposition process such as a flowable oxide deposition (PECVD and/or spin-on) process to backfill the III-N crystal structures with an electrically insulating oxide dielectric (e.g., $SiO_2$, SiON, SiOCN, SiOC(H)) or a nitride deposition (PECVD) process to backfill the III-N crystal structures with an electrically insulating dielectric (e.g., SiN). Operation 108 may then include chemical-mechanical polishing of the gap-filling dielectric and/or portions of the III-N crystal structures to expose a top surfaces of the III-N crystal structures.

In an embodiment, the planarization stops at a top surface of the III-N crystal structure. For example, with reference to FIG. 7, a dielectric layer may be provided on exposed portions of dielectric layer 502 and laterally adjacent to sidewalls 709, 710 leaving top surface 706 exposed. In an embodiment, the planarization may continue after reaching the III-N crystal structure (e.g., the III-N crystal structure having a planar top surface or a top surface meeting at a line or the like) to planarized both the III-N crystal structure and the gap filling dielectric to provide a planarized III-N crystal structure and gap filling dielectric surface. Such techniques are illustrated with respect to FIGS. 8-10 and elsewhere herein.

Figure 8:
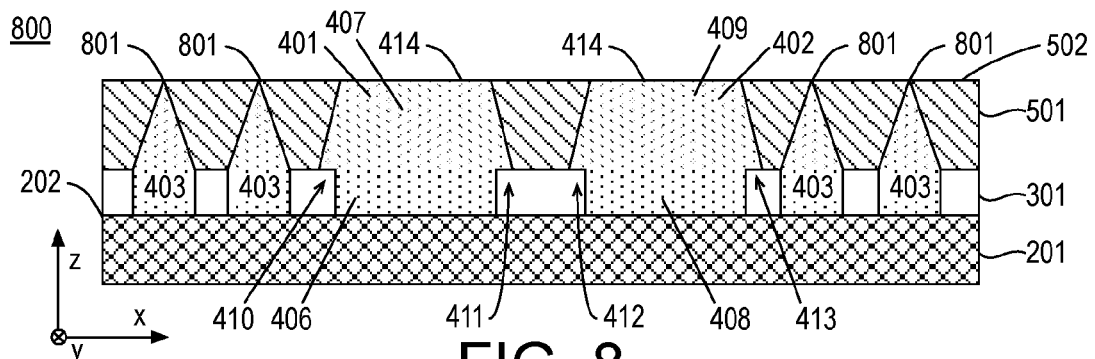

FIG. 8 illustrates an example semiconductor device structure 800 similar to semiconductor device structure 500, with the exception that top surface 502 of dielectric layer 501 exposes top portions 801 of dummy structures 403. Such a profile may be generated using any suitable technique or techniques. For example, at the planarization operation discussed with respect to operation 105, the III-N crystal structures may be planarized along with dielectric layer 501 (e.g., via a timed planarization or the like) until top portions 801 of dummy structures 403 are exposed. In an embodiment, the profile may be generated by tuning the widths of openings 302, 303 (please refer to FIG. 3) such that dummy structures 403 and crystal structures 401, 402, as generated by operations 103, 104 are substantially the same height (i.e., in the z-direction from surface 202 of substrate 201) such that the planarization at operation 105 stops at dummy structures 403 and III-N crystal structures 401, 402 thereby exposing both.

Figure 9:
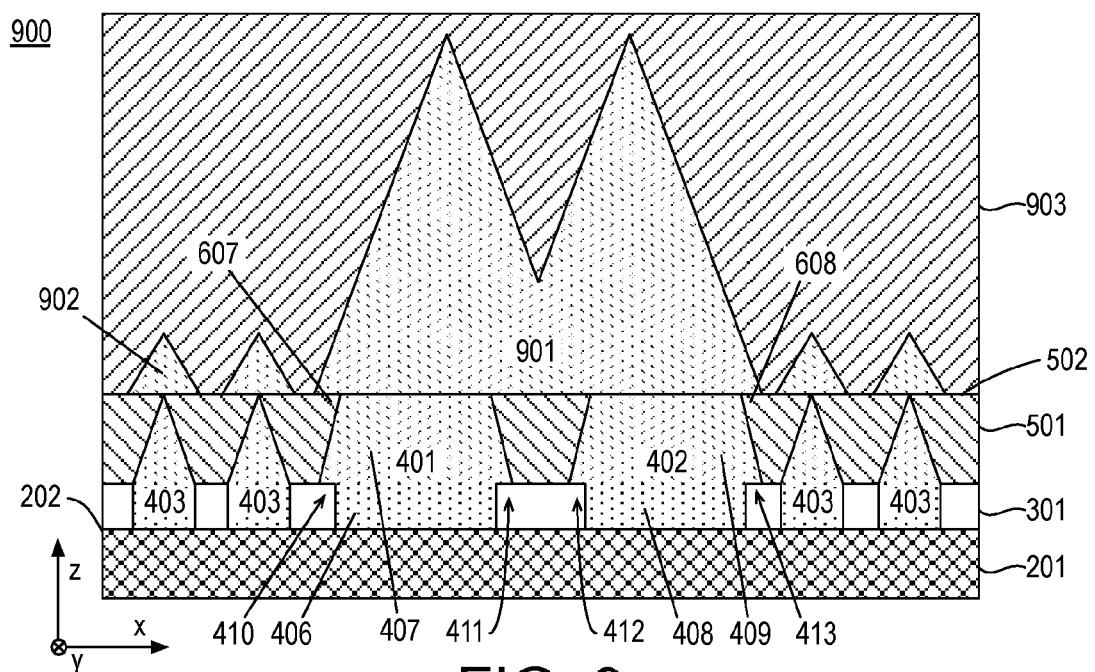

FIG. 9 illustrates an example semiconductor device structure 900 similar to semiconductor device structure 800, after the epitaxial growth of III-N crystal structure 901 and III-N crystalline dummy structures 902 as discussed with respect to operation 107 and after the formation of a dielectric layer 903 (e.g., a dielectric back fill layer) as discussed with respect to operation 108. Although not illustrated with respect to semiconductor device structure 900, semiconductor device structure 900 may include intervening layers between III-N crystal structures 401, 402 and III-N crystal structure 901 as is discussed further herein. III-N crystal structure 901 may have any suitable characteristics and/or relationships with other components as discussed with respect to III-N crystal structure 601 including overgrowth regions 607 608.

As shown, during operation 107 and the growth of III-N crystal structure 901 in analogy with the growth of III-N crystal structure 601, dummy structures 902 are grown from exposed top portions 801 of dummy structures 403. As shown, in some embodiments, dummy structures 902 extend onto regions of dielectric layer 501 adjacent to exposes top portions 801. Furthermore, dummy structures 902 are shorter than III-N crystal structure 901 due to being grown from much narrower openings and exhaustion of the c-plane along the z-axis. Dummy structures 902 may provide, for example, improved planarization processing (e.g., by eliminating dishing effects) in subsequent processing. Dielectric layer 903 may include any suitable material such as SiN, $SiO_2$, SiON, SiOCN, SiOC(H), benzocyclobutene (BCB), or a spin on glass (SOG) material. Furthermore, as shown in FIG. 9, dielectric layer 903 may, after deposition, bury III-N crystal structure 901 and dummy structures 902.

Figure 10:
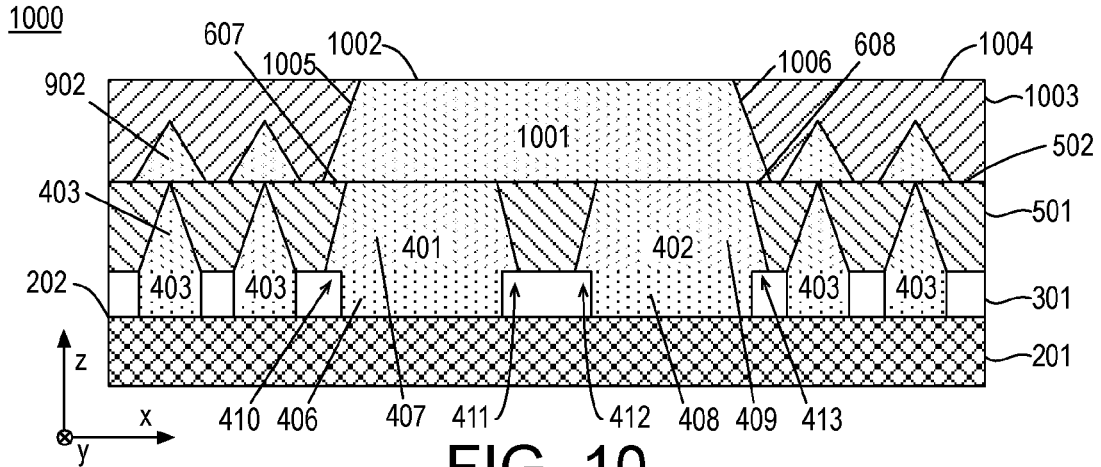

FIG. 10 illustrates an example semiconductor device structure 1000 similar to semiconductor device structure 900, after a planarization operation has been performed. Such a plananzation operation may be performed using any suitable technique or techniques such as chemical mechanical polish techniques. As shown, such planarization techniques provide a III-N crystal structure 1001 having an exposed top surface 1004 of dielectric layer 1003. Also as shown, dielectric layer 1003 may bury dummy structures 902 and dielectric layer 1003 may be laterally adjacent to sidewalk 1005, 1006 of III-N crystal structure 1001. As discussed herein with respect to FIG. 7, any suitable device may be formed on and/or within any portion of top surface 1002 of III-N crystal structure 1001. In an embodiment, dielectric layer 1003 may be removed prior to such device formation.

As discussed and illustrated with respect to FIGS. 6, 7, 9, and 10, III-N crystal structures 601, 701, 901, and 1001 may have sloped sidewalls such that the sloped sidewalk extend along a longitudinal direction of the III-N crystal structures and slope from a far lateral outer edge at the base of the III-N crystal structures inwardly toward a top centerline of the III-N crystal structures. Such sidewalk may, as discussed, provide for defects to advantageously bend toward and terminate at the sidewalls leaving a lower defect top surface for device formation.

Such sloped sidewalls may be provided using any suitable technique or techniques. In an embodiment, sloped sidewalls are provided based on the orientation of openings 302, 303 (please refer to FIG. 3) with respect to a crystal orientation of substrate 201 and/or based on processing conditions during growth. With continued reference to FIG. 3, in an embodiment, such sloped sidewalls are provided by utilizing substrate 201 comprising a crystalline group IV material (e.g., Si) having a (111) plane e.g., a (111) crystal plane in the x-y plane) and orienting openings 302, 303 such that the longitude length of openings 302, 303 (i.e., in the y-direction), which is substantially greater than the lateral width (i.e., in the x direction) of openings 302, 303, is oriented along a <110> direction of the (111) plane. For example, the longitude length of openings 302, 303 may be not less than 2.5× than the lateral width of openings 302, 303. That is, sloped sidewalls may be provided by extending openings along a <110> direction of a (111) plane of a crystalline group IV material substrate such as a Si substrate. In such embodiments, the III-N crystal structures may have a c-plane (i.e., either +c for Ga-face GaN or -c for N-face GaN) that is opposite surface 202 of substrate 201 and the sidewalls may be semi-polar planes (e.g., (11-22) planes).

Figure 11:
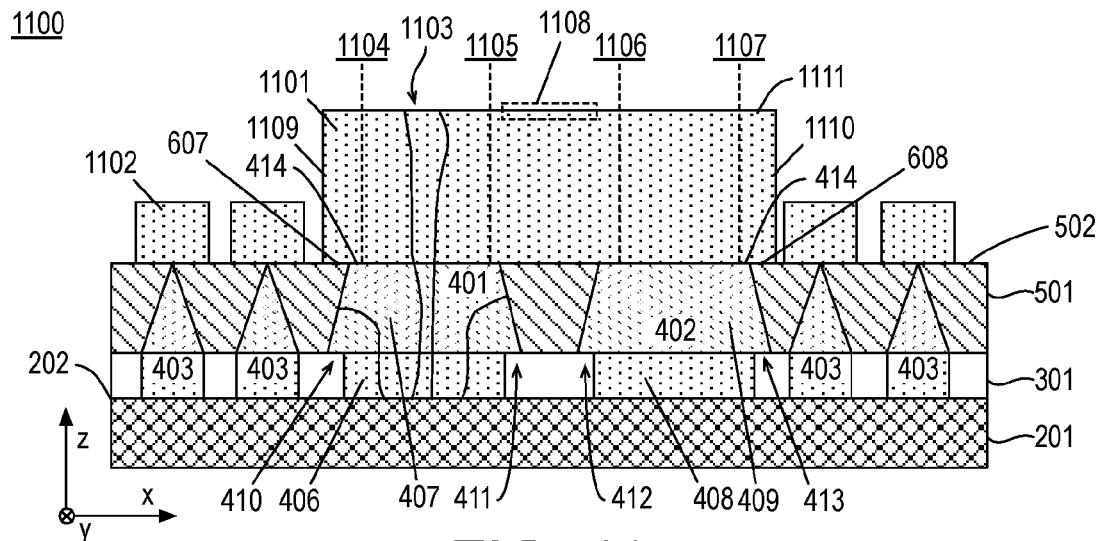
Figure 12:
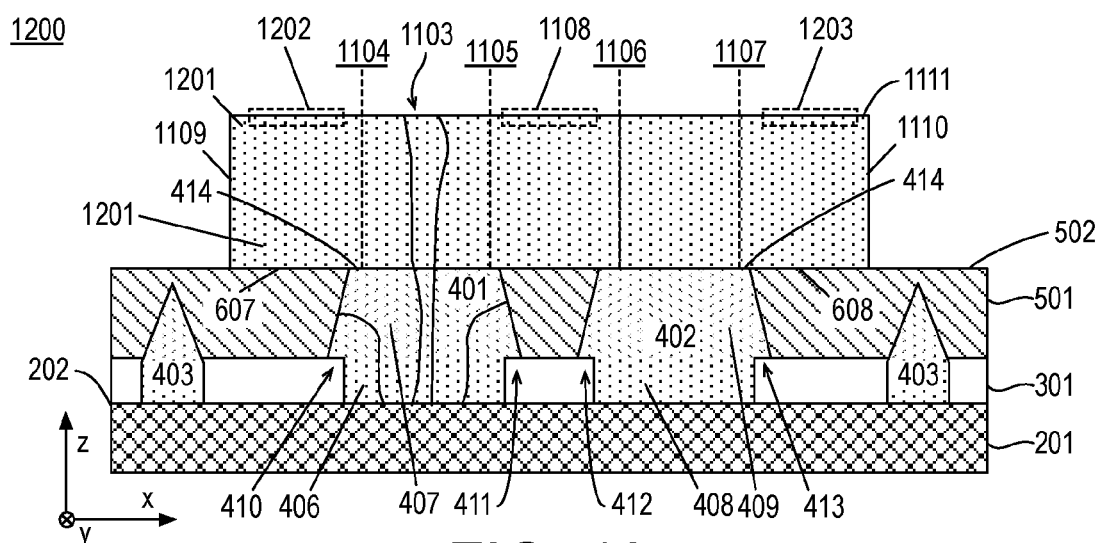

In other embodiments, second level III-N crystal structures may be grown with sidewalls substantially orthogonal to a substrate surface as illustrated with respect to FIGS. 11 and 12.

FIG. 11 illustrates an example semiconductor device structure 1100 similar to semiconductor device structure 800, after the epitaxial growth of III-N crystal structure 1101 and III-N crystalline dummy structures 1102 as discussed with respect to operation 107. As shown, semiconductor device structure 1100 and dummy structures 1102 have sidewalls that are substantially orthogonal with respect to surface 202 of substrate 201. For example, as illustrated with respect to sidewalls 1109, 1110 of semiconductor device structure 1100, semiconductor device structure 1100 and dummy structures have sidewalls that are parallel to the z-direction. For example, under conditions discussed below, the LEO process employed at operation 107 favors formation of orthogonal sidewall facets as illustrated with respect to sidewalls 1109, 1110 of III-N crystal structure 1001 which may be substantially parallel (e.g., at an angle of about 0°) with respect to the z-axis. For example, sidewalls 1109, 1110 extend along the longitudinal length of III-N crystal structure 1101 (i.e., along the y-direction) and sidewalls 1109, 1110 are orthogonal to surface 202 of substrate 201 (e.g., orthogonal to the x-y plane). Also as shown, III-N crystal structure 1101 extends onto overgrowth regions 607, 608 as discussed herein.

Such orthogonal sidewalls may be provided using any suitable technique or techniques. In an embodiment, orthogonal sidewalls are provided based on the orientation of openings 302, 303 (please refer to FIG. 3) with respect to a crystal orientation of substrate 201 and/or based on processing conditions during growth. With continued reference to FIG. 3, in an embodiment, such orthogonal sidewalls are provided by utilizing substrate 201 comprising a crystalline group IV material (e.g., Si) having a (111) plane (e.g., a (111) crystal plane in the x-y plane) and orienting openings 302, 303 such that the longitude length of openings 302, 303 (i.e., in the y-direction), which is substantially greater than the lateral width (i.e., in the x direction) of openings 302, 303, is oriented along a <11-2> direction of the (111) plane. For example, the longitude length of openings 302, 303 may be not less than 2.5× than the lateral width of openings 302, 303. That is, orthogonal sidewalls may be provided by extending openings along a <11-2> direction of a (111) plane of a crystalline group IV material substrate such as a Si substrate. In such embodiments, the III-N crystal structures may have a c-plane (i.e., either +c for Ga-face GaN or -c for N-face GaN) that is opposite surface 202 of substrate 201 and the sidewalls may be non-polar planes (e.g., (11-20) planes).

Furthermore, as shown in FIG. 11, defects 1103 may propagate vertically (i.e., in the z-direction) through III-N crystal structure 1101. For example, given the orthogonal sidewalls of III-N crystal structure 1101, such defects may not bend toward sidewalls 1109, 1110 but instead may propagate to top surface 1111 of III-N crystal structure 1101. As shown with respect to vertical lines 1104, 1105, 1106, 1107 the region of top surface 1111 over top surfaces 414 of III-N crystal structures 401, 402 and, in particular the region of top surface 111 close to the centerlines of III-N crystal structures 401, 402 may have relatively high defect densities. However, region 1108 of top surface 1111 of III-N crystal structure 1101 due to not being over or near the centerlines of III-N crystal structures 401, 402 is a low defect density region. In some embodiments, defect density sensitive devices may be formed only on or within region 1108 and/or only on or within regions laterally external to with respect to vertical lines 1104, 1107 (e.g., in regions, not shown, extending from vertical lines 1104, 1107 laterally outwardly therefrom). As shown, vertical lines 1104, 1107 may be at or inward about 20 nanometers from outer edges of over top surfaces 414 of III-N crystal structures 401, 402. In some embodiments, such lateral external regions may be enlarged for increased device area as shown with respect to FIG. 12.

FIG. 12 illustrates an example semiconductor device structure 1200 similar to semiconductor device structure 500, after the epitaxial growth of III-N crystal structure 1201 as discussed with respect to operation 107. As shown, III-N crystal structure 1201 includes orthogonal sidewalls 1109, 1110 as discussed with respect to FIG. 11, which may be formed using any suitable technique or techniques such as those discussed with respect to III-N crystal structure 1101. Furthermore, as shown in FIG. 12 and as discussed above, defects 1103 may propagate vertically (i.e., in the z-direction) through III-N crystal structure 1201 within a region above III-N crystal structures 401, 402 and, in particular, over and near the centerlines of III-N crystal structures 401, 402. As discussed, region 1108 of top surface 1111 of III-N crystal structure 1201 due to not being over or near the centerlines of III-N crystal structures 401, 402 is a low defect density region. In some embodiments, defect density sensitive devices may be formed only on or within region 1108 and/or only on or within regions laterally external to with respect to vertical lines 1104, 1107 such as regions 1202, 1203. As shown, vertical lines 1104, 1107 may be at or inward about 20 nanometers from outer edges of over top surfaces 414 of III-N crystal structures 401, 402. In an embodiment region 1202 has one edge 10 to 20 nm outward (i.e., in the negative x-direction) with respect to vertical line 1104 and another edge at sidewall 1109 or up to 10 to 20 from sidewall 1109. Similarly, region 1203 may have one edge 10 to 20 nm outward with respect to vertical line 1107 (i.e., in the x-direction) and another edge at sidewall 1110 or up to 10 to 20 from sidewall 1010.

As discussed, in some embodiments, lower level III-N crystal structures 401, 402 and adjacent dummy structures 403 are separate (i.e., laterally separated by portions of dielectric layer 501 in gaps therebetween. In some embodiments, level III-N crystal structures 401, 402 and adjacent dummy structures 403 may be advantageously merged with III-N crystal structures 401, 402 having exposed surfaces while the dummy structures are buried dielectric layer 501 (i.e., the dummy structures have a top surface that is below the top surface of dielectric layer 501).

Figure 13:
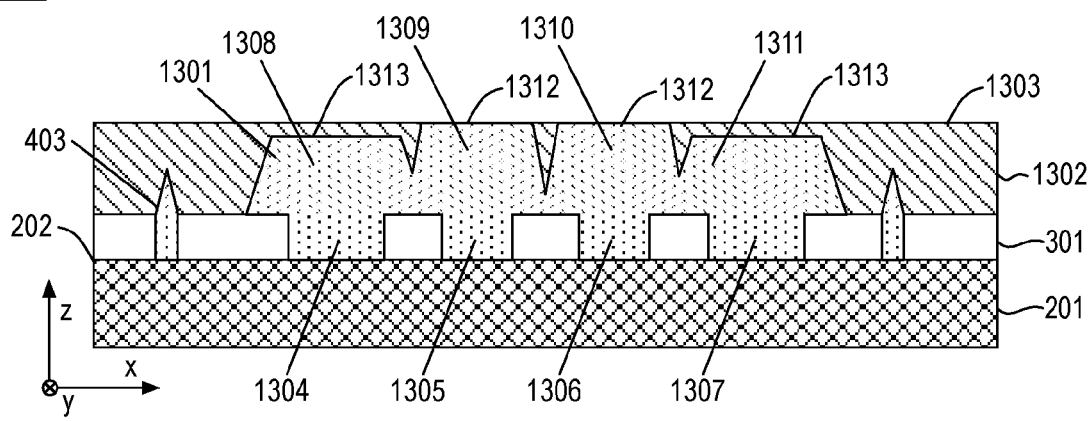

FIG. 13 illustrates an example semiconductor device structure 1300 similar to semiconductor device structure 300, after the epitaxial growth of III-N crystal structure 1301 and III-N crystal dummy structures 403 as discussed with respect to operations 103, 104 and the formation of dielectric layer 1302 as discussed with respect to operation 105. III-N crystal structure 1301 may include any material and characteristics as discussed herein with respect to III-N crystal structures 401, 402.

As shown in FIG. 13, III-N crystal structure 1301 has portions 1304, 1305, 1306, 1307 that fill their corresponding openings and portions 1308, 1309, 1310, 1311 that have merged during growth. Furthermore, as shown, portions 1309, 1310 have a greater vertical height (i.e., in the z-direction from surface 202 of substrate 201 to a top surface 1312 of portions 1309, 1310) than that of portions 1308, 1311 (i.e., in the z-direction from surface 202 of substrate 201 to a top surface 1313 of portions 1308, 1311). For example, at operations 103, 104, GaN (undoped, n-doped or p-doped) islands may be formed and merged as illustrated in FIG. 13. Notably, portions 1308, 1311 (e.g., two trapezoidal islands on the side) have a lower height than portions 1309, 1310 (e.g., the two trapezoidal islands in the middle). Such a configuration may be attained by tuning the lateral widths of the openings corresponding to portions 1308, 1309, 1310, 1311. In an embodiment, the lateral width of the openings filled by portions 1304, 1307 (e.g., the trench openings corresponding to the outer trapezoidal islands) is greater than the lateral width of the openings filled by portions 1305, 1306. In an embodiment, the lateral width of the openings filled by portions 1304, 1307 is not less than 1.3 times the lateral width of the openings filled by portions 1305, 1306.

Also as shown in FIG. 13 after the formation of dielectric layer 1302 as discussed with respect to operation 105, dielectric layer 1302 includes a top surface 1303 that is substantially planar with respect to top surface 1312 of portions 1309, 1310 and that is at a greater height and buries top surface 1313 of portions 1308, 1311. Dielectric layer 1302 may be formed using any suitable technique or techniques. For example, operation 105 may be implemented to form dielectric layer 1302 by bulk depositing any discussed dielectric and chemical-mechanical polishing of the dielectric and selectively stopping on top surface 1312 of portions 1309, 1310.

Figure 14:
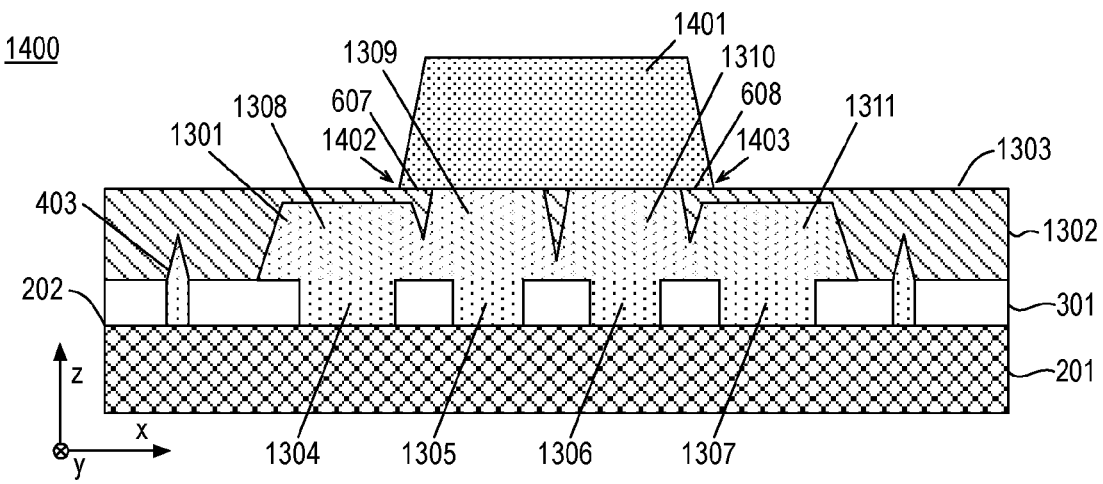

FIG. 14 illustrates an example semiconductor device structure 1400 similar to semiconductor device structure 1300, after the formation of III-N crystal structure 1401. III-N crystal structure 1401 may include any materials or characteristics as discussed herein with respect to III-N crystal structures 601, 701, 1001, 1101, 1201, or any other upper level III-N crystal structures. In the illustrated embodiment, III-N crystal structure 1401 has sloped sidewalls and extends laterally onto top surface 1303 of dielectric layer 1302 as discussed herein. In other embodiments, III-N crystal structure 1401 may have orthogonal sidewalls. Furthermore, as shown, lateral edges 1402, 1403 of III-N crystal structure 1401 extend over a portion of portions 1308, 1311 but not over an entirety of portions 1308, 1311. Such a configuration may provide advantageously provide vertical access to portions 1308, 1311 for contact thereto as is discussed further herein.

Returning now to FIG. 1 and optional operation 106, as discussed, methods 100 may include forming an intervening layer on exposed portions of III-N crystal structures formed at operations 103, 104. As discussed herein, the intervening layer provides for defect bending toward the intervening layer and/or away from a vertical direction during subsequent crystal growth of second level or higher level III-N crystal structures. The intervening layer may include any suitable material in any suitable configuration such that the intervening layer is an amorphous material or a crystalline material having a lattice constant mismatch with respect to the underlying and/or overlying III-N crystal structures. In some embodiments, the intervening layer is a continuous layer over the exposed portions of III-N crystal structures. In some embodiments, the intervening layer includes islands (e.g., sporadic islands) of an amorphous material or a crystalline material having a lattice constant mismatch with respect to the underlying and/or overlying III-N crystal structures. The intervening layer may be formed using any suitable technique or techniques for the selected material. In some embodiments, the intervening layer includes crystalline AlN or crystalline SiN formed using low temperature chemical vapor deposition (CVD) techniques. In an embodiment, the intervening layer includes amorphous AlN or GaN formed using ALD techniques.

Figure 15:
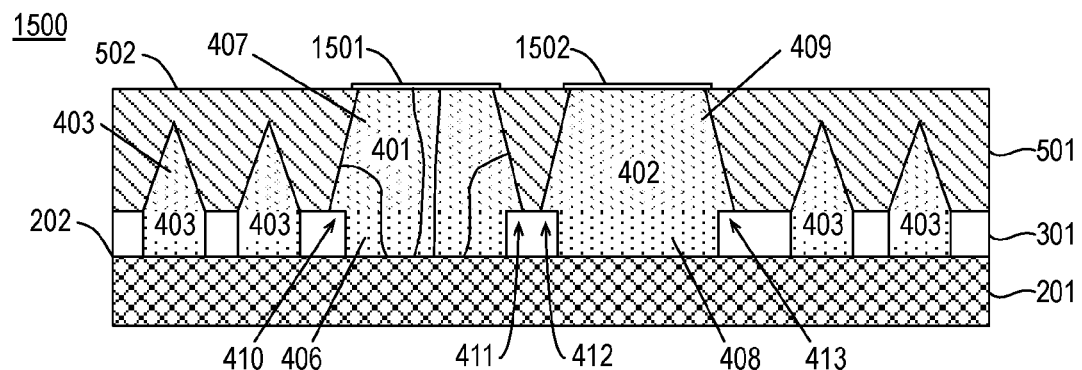

FIG. 15 illustrates an example semiconductor device structure 1500 similar to semiconductor device structure 500, after the formation of intervening layers 1501, 1502 on exposed surfaces of III-N crystal structures 401, 402 at operation 106 of methods 100. In the illustrated embodiment, intervening layers 1501, 1502 are formed on exposed surfaces of III-N crystal structures 401, 402. Intervening layers 1501, 1502 may be formed on any lower level III-N crystal structures 401, 402 discussed herein such as exposed surfaces 1312 of portions 1309, 1320 of III-N crystal structure 1301.

As discussed, intervening layers 1501, 1502 may include any suitable material in any suitable configuration such that intervening layers 1501, 1502 are amorphous materials or crystalline materials having a lattice constant mismatch with respect to III-N crystal structures 401, 402 and/or overlying III-N crystal structures discussed further below. Notably, intervening layers 1501, 1502 must accommodate crystal growth of subsequently formed III-N crystal structures. Intervening layers 1501, 1502 provide for defect reduction or filtering through defect bending or the like. For example, due to strain induced in III-N crystal structures 401, 402 and/or overlying III-N crystal structures by intervening layers 1501, 1502 being amorphous or having a lattice constant mismatch (e.g., intervening layers 1501, 1502 may be pseudomorphic materials such that they do not relax and provide strain though lattice constant mismatch). Intervening layers 1501, 1502 may be characterized as defect bending layers, defect filter layers, or the like.

Figure 16:
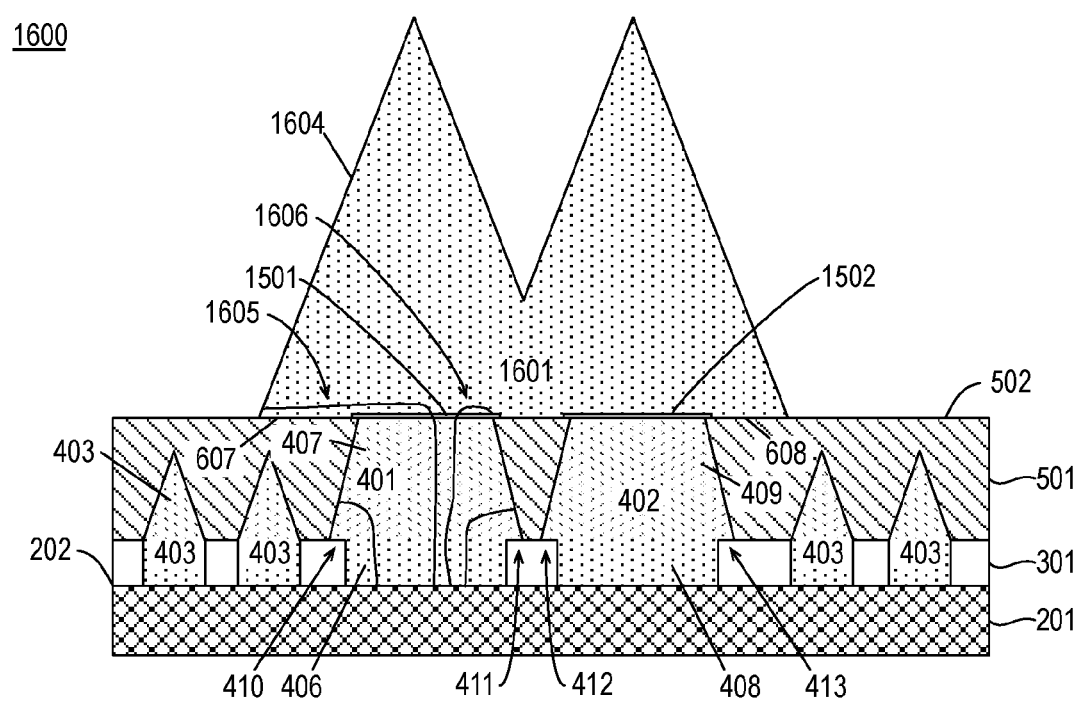

FIG. 16 illustrates an example semiconductor device structure 1600 similar to semiconductor device structure 1500, after the epitaxial growth of III-N crystal structure 1601. III-N crystal structure 1601 may include any suitable crystalline III-N materials or alternative wurtzite semiconductor materials discussed herein. Furthermore, III-N crystal structure 1601 may have any characteristics as discussed with respect to III-N crystal structure 601 or any other second level III-N crystal structure discussed herein. In the illustrated embodiment, III-N crystal structure 1601 is grown in analogy with III-N crystal structure 601. However, as discussed, intervening layers 1501, 1502 may be provided between any lower level and higher level III-N crystal structures. As shown, III-N crystal structure 1601 extends laterally onto regions of dielectric layer 501 in a manner discussed with respect to FIG. 6.

As discussed, intervening layers 1501, 1502 provide for defect reduction or filtering through defect bending or the like as illustrated with respect to defects 1605, 1606. For example, due to strain induced in III-N crystal structures 401, 402 and/or overlying III-N crystal structures by intervening layers 1501, 1502, defects 1605, 1606 bend during the growth of III-N crystal structure 1601 toward intervening layers 1501, 1502 such that defects may terminate at the intervening layers 1501, 1502 as illustrate with respect to defect 1606 or such that defects are more likely to bend toward a sidewall 1604 of III-N crystal structure 1601. Thereby, defect densities in III-N crystal structure 1601 are reduced.

In the illustrated embodiment, intervening layers 1501, 1502 are continuous layers over the entireties of exposed surfaces of III-N crystal structures 401, 402. In such embodiments, III-N crystal structure 1601 may grow from intervening layers 1501, 1502. In an embodiment, intervening layers 1501, 1502 include continuous layers of crystalline AlN and one or both of III-N crystal structures 401, 402 and III-N crystal structure 1601 include GaN (doped or undoped) such that the crystalline MN has a lattice constant mismatch with respect to the GaN III-N crystal structures. III-N crystal structure 1601 grown at operation 107 may be grown from the AlN layer as a crystalline seed layer. In some embodiments, the crystalline AlN intervening layers 1501, 1502 may be discontinuous such that islands of crystalline AlN are provided on exposed surfaces of III-N crystal structures 401, 402 and III-N crystal structure 1601 may be grown from the AlN islands and the underlying GaN crystal structures 401, 402.

In other embodiments, intervening layers 1501, 1502 include continuous layers of an amorphous material such as AlN or GaN formed using ALD or the like. In an embodiment, III-N crystal structures 401, 402 include GaN and intervening layers 1501, 1502 include amorphous AlN or GaN. In such embodiments, during the formation of III-N crystal structure 1601, at least portions of the amorphous AlN or GaN, including a top surface of the amorphous AlN or GaN re-crystallizes to provide a seed layer for the growth of III-N crystal structure 1601. In an embodiment, the top surface of the amorphous AlN or GaN intervening layers 1501, 1502 re-crystallizes while a bottom portion of the AlN or GaN intervening layers 1501, 1502 remains amorphous. As discussed above, in some embodiments, the amorphous AlN or GaN intervening layers 1501, 1502 may be discontinuous such that islands of amorphous AlN or GaN are provided on exposed surfaces of III-N crystal structures 401, 402 and subsequent crystal structures grown at operation 107 may be grown from the amorphous AlN or GaN (as top surfaces thereof re-crystalize) and/or the underlying GaN III-N crystal structures 401, 402.

In yet other embodiments, intervening layers 1501, 1502 include discontinuous layers of a crystalline material other than a III-N material such as a group IV-N crystalline material. In an embodiment, intervening layers 1501, 1502 include discontinuous layers having islands of SiN formed using low temperature CVD. Such islands of SiN form sporadic islands on exposed surfaces of III-N crystal structures 401, 402 leaving some portions of the surfaces of III-N crystal structures 401, 402 exposed. Such SiN crystalline islands have a lattice mismatch with respect to exposed surfaces of III-N crystal structures 401, 402 and/or III-N crystal structure 1601 to provide a strain that, as discussed bends defects therein to advantageously reduce defects. In such embodiments, the discontinuities in the IV-N crystalline intervening layers 1501, 1502 provide for openings or gaps such that III-N crystal structure 1601 may be grown from the exposed surfaces of the underlying GaN III-N crystal structures 401, 402.

Semiconductor device structure 1600 may be further processed as discussed herein. In an embodiment, semiconductor device structure 1600 is processed as discussed herein with respect to FIG. 7 such that a continued epitaxial growth of III-N crystal structure 1601 forms a III-N crystal structure analogous to III-N crystal structure 701 having a trapezoidal cross-section (i.e., along the x-z plane) and a low defect density top surface for the formation of devices as discussed. In an embodiment, semiconductor device structure 1600 is processed as discussed herein with respect to FIGS. 9 and 10 such that a dielectric deposition and planarization operations form a III-N crystal structure analogous to III-N crystal structure 1001 having a trapezoidal cross-section (i.e., along the x-z plane) and a low defect density top surface for the formation of devices as discussed. Furthermore, intervening layers 1501, 1502 may be provided between any lower and higher level III-N crystal structures discussed herein such as between III-N crystal structures 401, 402 and III-N crystal structure 1101 as illustrated with respect to FIG. 11, between III-N crystal structures 401, 402 and III-N crystal structure 1201 as illustrated with respect to FIG. 12, or between portions 1309, 1310 of III-N crystal structure 1301 and III-N crystal structure 1401 as illustrated with respect to FIG. 14.

Methods 100 and the semiconductor device structures discussed therewith provide for low defect density crystalline III-N films, surfaces, materials, etc. for the fabrication of devices. Such devices may include diodes, transistors, or other devices that may advantageously utilize III-N materials. For example, such devices may be used in power management integrated circuits (PMICs) and radio frequency (RF) power amplifiers in computing platforms, automotive applications, etc.

Figure 17:
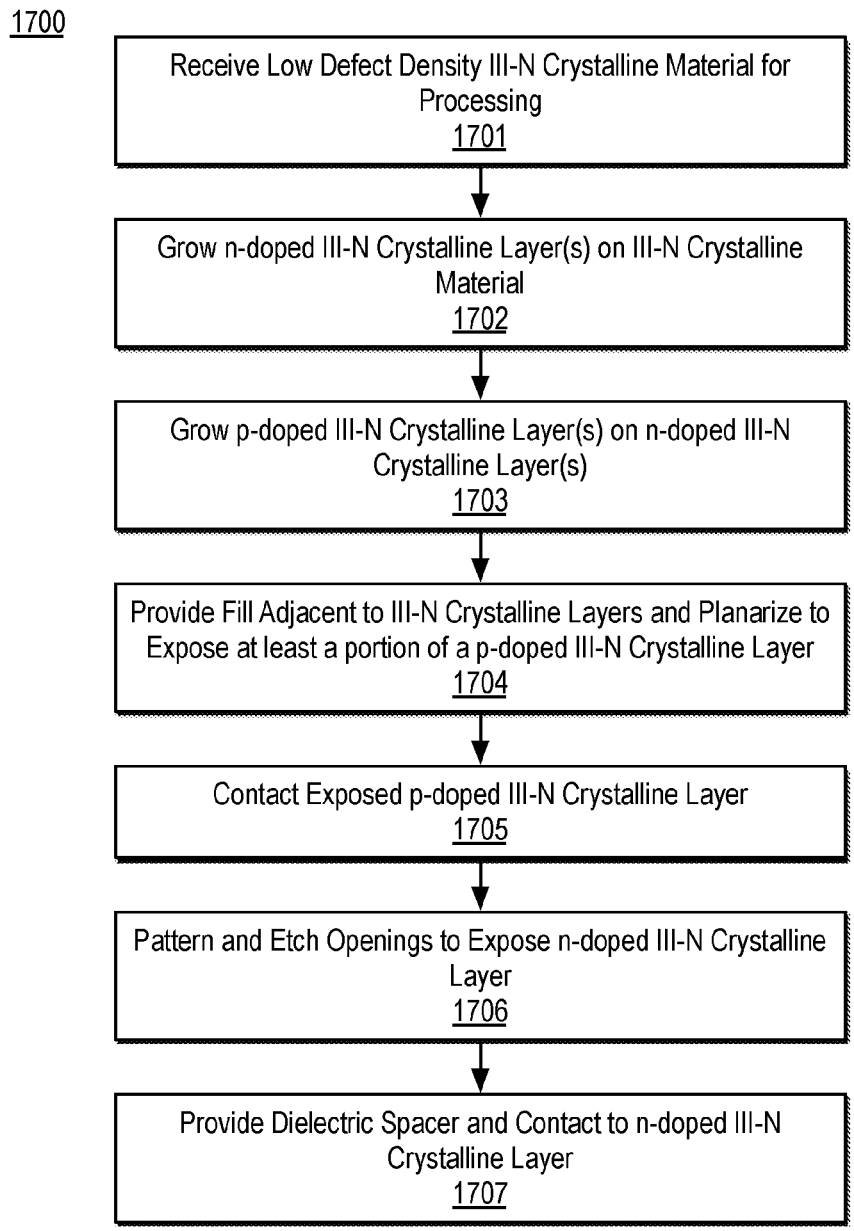
FIG. 17 is a flow diagram illustrating methods for forming diode device structures implementing a low defect density III-N material.

FIG. 17 is a flow diagram illustrating methods 1700 for forming diode device structures implementing a low defect density III-N material, arranged in accordance with at least some implementations of the present disclosure. FIGS. 18, 19, 20, and 21 are cross-sectional views of exemplary diode device structures as selected fabrication operations in the methods 1700 are performed, in accordance with some embodiments.

As shown in FIG. 17, methods 1700 begin at operation 1701, where a low defect density III-N crystalline material is received for processing. The low defect density film may be received for processing using any suitable technique or techniques. For example, a low detect density III-N crystalline material or film may be generated or formed using any suitable technique or techniques discussed with respect to methods 100.

Figure 18:
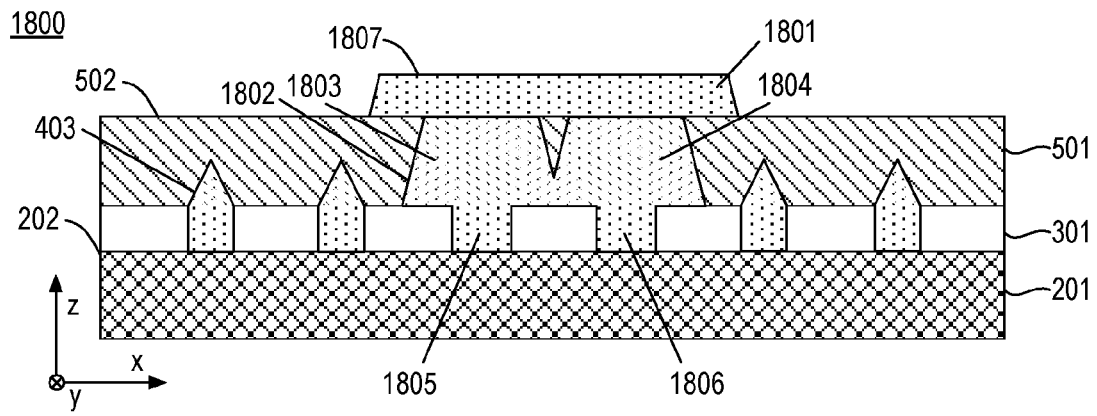
FIGS. 18, 19, 20, and 21 are cross-sectional views of exemplary diode device structures as selected fabrication operations in the methods of FIG. 17 are performed.

FIG. 18 illustrates an example diode device structure 1800 including an example III-N crystalline material 1801. Although illustrated with diode device structure 1800, which provides a structure similar to semiconductor device structure 600, any semiconductor device structure discussed with respect to methods 100, such as semiconductor device structure 600, semiconductor device structure 1000, semiconductor device structure 1100, semiconductor device structure 1200, semiconductor device structure 1400, or any of those semiconductor device structures with intervening layers, etc. may be used to provide III-N crystalline material 1801 for processing.

As shown in FIG. 18, III-N crystalline material 1801 may be grown from a III-N crystalline structure 1802 as discussed herein. For example, III-N crystalline structure 1802 may be epitaxially grown from a seed surface of substrate 201 and within openings of dielectric layer as discussed herein such that III-N crystalline structure 1802 has portions 1805, 1806 within the openings and laterally adjacent to portions of dielectric layer 301 and portions 1803, 1804 extending above the openings and laterally over regions of dielectric layer. In the illustrated embodiment, portions 1803, 1804 of III-N crystalline structure 1802 have merged. However, portions 1803, 1804 may be separated by entirely by a portion of dielectric layer 501. Furthermore, diode device structure 1800 may include dielectric layer 501 laterally adjacent to portions 1803, 1804 and on exposed regions of dielectric layer 301. III-N crystalline structure 1802 may include any suitable materials or characteristics discussed herein with respect to operations 103, 104 and corresponding device structures. Similarly, III-N crystalline material 1801 may include any suitable materials or characteristics discussed herein with respect to operation 107 and corresponding device structures. In an embodiment, III-N crystalline material 1801 is undoped GaN.

Returning to FIG. 17, methods 1700 continue at operation 1702, where one or more n-doped III-N crystalline layers are epitaxially grown from the III-N crystalline material. The one or more n-doped III-N crystalline layers may be epitaxially grown using any suitable technique or techniques. For example, operation 1702 may include MOCVD, VPE, HVPE, or MBE techniques. In an embodiment, operation 1702 includes growing a n-doped III-N crystalline GaN layer and a subsequent lightly n-doped III-N crystalline GaN layer. For example, the n-doped III-N crystalline GaN layer may be doped with Si grown in situ with the n-doped III-N crystalline GaN layer. The lightly n-doped III-N crystalline GaN layer may also be doped with Si grown in situ with the lightly n-doped III-N crystalline GaN layer such that the n-doped III-N crystalline GaN layer has a greater concentration than the lightly n-doped III-N crystalline GaN layer such as an order of magnitude greater concentration.

Methods 1700 continue at operation 1703, where one or more p-doped III-N crystalline layers are epitaxially grown from the n-doped III-N crystalline layer(s). The one or more p-doped III-N crystalline layers may be epitaxially grown using any suitable technique or techniques such as MOCVD, VPE, HVPE, or MBE techniques. In an embodiment, operation 1703 includes growing a lightly p-doped III-N crystalline GaN layer and a subsequent p-doped III-N crystalline GaN layer. For example, the p-doped III-N crystalline GaN layer may be doped with Mg grown in situ with the p-doped III-N crystalline GaN layer and the lightly p-doped III-N crystalline GaN layer may also be doped with Mg grown in situ with the lightly p-doped III-N crystalline GaN layer such that the p-doped III-N crystalline GaN layer has a greater concentration than the lightly p-doped crystalline GaN layer such as an order of magnitude greater concentration.

Figure 19:
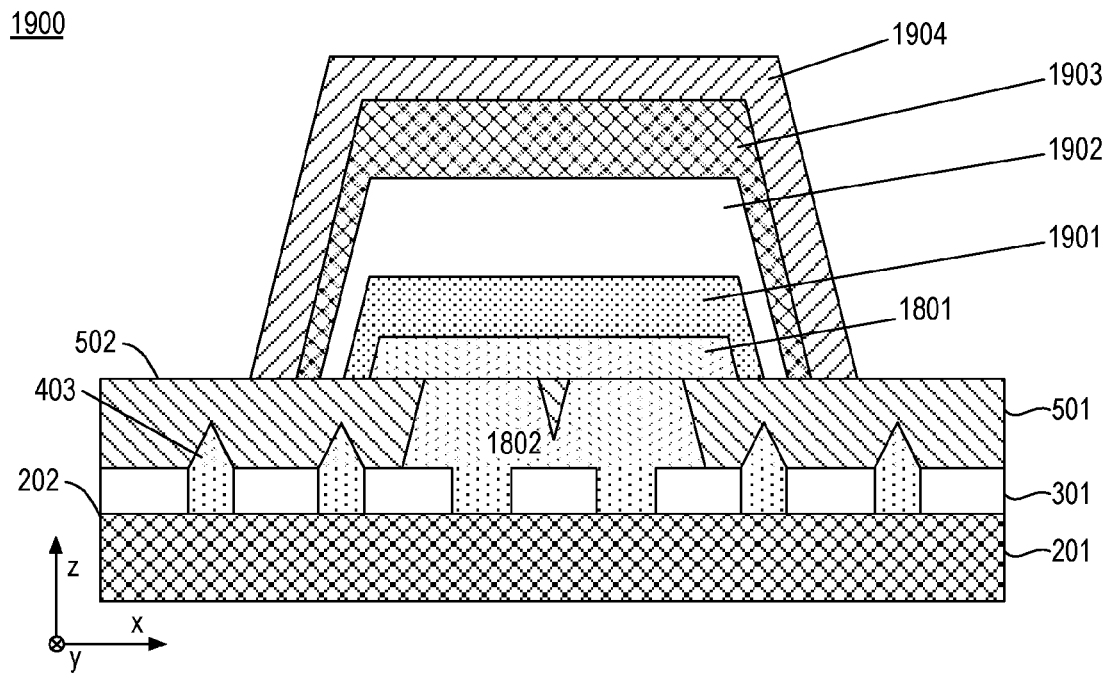

FIG. 19 illustrates an example diode device structure 1900 similar to diode device structure 1800, after the epitaxial growth of an n-doped crystalline layer 1901, a lightly n-doped III-N crystalline layer 1902, a lightly p-doped III-N crystalline layer 1903, and a p-doped crystalline layer 1904. III-N crystalline material 1801, n-doped III-N crystalline layer 1901, a lightly n-doped III-N crystalline layer 1902, a lightly p-doped III-N crystalline layer 1903, and a p-doped III-N crystalline layer 1904 may include any III-N materials or alternative wurtzite semiconductors discussed herein. As shown, in an embodiment, n-doped III-N crystalline layer 1901 is on and coupled to III-N crystalline material 1801, lightly n-doped III-N crystalline layer 1902 is on and coupled to n-doped III-N crystalline layer 1901, lightly p-doped III-N crystalline layer 1903 is on and coupled to lightly n-doped III-N crystalline layer 1902, and a p-doped III-N crystalline layer 1904 is on and coupled to lightly p-doped III-N crystalline layer 1903. As shown, in some embodiments, each layer of the material stack is over and wraps around the sides of the previous layer in the stack.

In an embodiment, crystalline material 1801 is undoped GaN, n-doped III-N crystalline layer 1901 is GaN doped with Si, lightly n-doped III-N crystalline layer 1902 is GaN doped with Si at lower concentration, p-doped III-N crystalline layer 1904 is GaN doped with Mg, and lightly p-doped III-N crystalline layer 1903 is GaN doped with Mg at lower concentration. For example, n-doped III-N crystalline layer 1901 may have a Si dopant concentration not less than an order of magnitude greater than the Si dopant concentration of lightly n-doped III-N crystalline layer 1902. In an embodiment, n-doped III-N crystalline layer 1901 is GaN with a Si dopant concentration of not less than $1e18/cm^3$ and advantageously more than $1e19/cm^3$. As discussed, lightly n-doped III-N crystalline layer 1902 may have a Si dopant concentration that is not less than an order of magnitude less such that when n-doped III-N crystalline layer 1901 is GaN with a Si dopant concentration of not less than $1e18/cm^3$, lightly n-doped III-N crystalline layer 1902 is GaN with a Si dopant concentration of not more than $1e17$ $cm^3$ and when n-doped III-N crystalline layer 1901 is GaN with a Si dopant concentration of not less than $1e19/cm^3$, lightly n-doped III-N crystalline layer 1902 is GaN with a Si dopant concentration of not more than $1e18$ $cm^3$.

Similarly, p-doped III-N crystalline layer 1904 may have a Mg dopant concentration not less than an order of magnitude greater than the Mg dopant concentration of lightly p-doped III-N crystalline layer 1903. In an embodiment, p-doped III-N crystalline layer 1904 is GaN with a Mg dopant concentration of not less than $1e19/cm^3$ and advantageously more than $1e20/cm^3$. As discussed, lightly p-doped III-N crystalline layer 1903 may have a Mg dopant concentration that is not less than an order of magnitude less such that when p-doped III-N crystalline layer 1904 is GaN with a Mg dopant concentration of not less than $1e19/cm^3$, lightly p-doped III-N crystalline layer 1903 is GaN with a Mg dopant concentration of not more than $1e18 \ cm^3$ and when p-doped III-N crystalline layer 1904 is GaN with a Mg dopant concentration of not less than $1e20/cm^3$, lightly p-doped III-N crystalline layer 1903 is GaN with a Mg dopant concentration of not more than $1e19 \ cm^3$. In an embodiment, lightly p-doped III-N crystalline layer 1903 is GaN with a Mg dopant concentration in the range of $1e17/cm^3$ to $1e19/cm^3$. Furthermore, p-doped III-N crystalline layer 1904 is highly doped GaN with a Mg concentration of $1e21/cm^3$ or more.

III-N crystalline material 1801, n-doped III-N crystalline layer 1901, lightly n-doped III-N crystalline layer 1902, lightly p-doped III-N crystalline layer 1903, and p-doped III-N crystalline layer 1904 may have any suitable thickness (i.e., in the z-direction). In an embodiment, III-N crystalline material 1801 has a thickness in the range of 4 to 10 um. In an embodiment, n-doped III-N crystalline layer 1901 has a thickness in the range of 1.5 to 3 um, with 2 um being particularly advantageous. In an embodiment, lightly n-doped III-N crystalline layer 1902 has a thickness in the range of 8 to 12 um, with 10 um being particularly advantageous. In an embodiment, lightly p-doped III-N crystalline layer 1903 has a thickness in the range of 300 to 700 nm, with 500 nm being particularly advantageous. In an embodiment, p-doped III-N crystalline layer 1904 has a thickness in the range of 8 to 15 nm, with 10 nm being particularly advantageous.

Returning to FIG. 17, methods 1700 continue at operation 1704, where a dielectric fill material is provided adjacent to the crystalline layers and the dielectric fill material is planarized to expose the top most p-doped III-N crystalline layer formed at operation 1703. For example, operation 1704 may include a gap-filling dielectric deposition process such as a flowable oxide deposition, a bulk deposition, a spin on glass operation, a BCB deposition, or the like with an electrically insulating dielectric (e.g., SiO2, SiON, SiOCN, SiOC(H), SiN, SOG, BCB, etc.). In an embodiment, a nitride deposition (PECVD) process may be employed to backfill the III-N crystal structures with an electrically insulating dielectric (e.g., SiN). Operation 1704 may then include chemical-mechanical polishing of the gap-filling dielectric, stopping on a top surface of top most p-doped III-N crystalline layer.

Methods 1700 continue at operation 1705, where the p-doped III-N crystalline layer exposed at operation 1704 is contacted with a conductive contact material such as an ohmic contact metal or the like. The contact may be formed using any suitable technique or techniques. In an embodiment, a bulk material layer is formed by deposition processing and patterned via patterning and etch processing to form the contact. The contact metal may include any suitable material or materials. In an embodiment, the contact includes one or more of platinum, palladium, indium tin oxide, or nickel.

Figure 20:
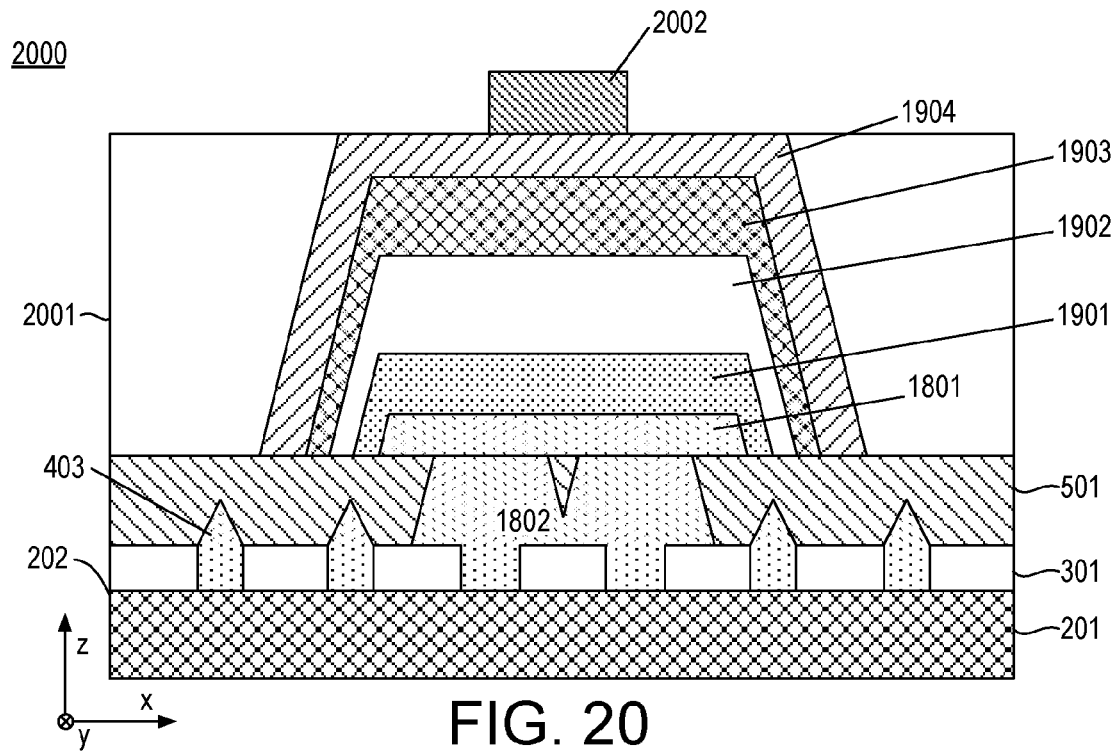

FIG. 20 illustrates an example diode device structure 2000 similar to diode device structure 1900, after the formation of a dielectric layer 2001 and a contact 2002 as discussed with respect to operations 1704, 1705. As shown, dielectric layer 2001, after planarization, is on or over previously exposed portions of dielectric layer 501 and laterally adjacent to the material stack provided by III-N crystalline material 1801, n-doped III-N crystalline layer 1901, lightly n-doped III-N crystalline layer 1902, lightly p-doped III-N crystalline layer 1903, and p-doped III-N crystalline layer 1904. As discussed contact 2002 may include any suitable material or materials such as p-type ohmic contact metals such as one or more of platinum, palladium, indium tin oxide, or nickel. As shown, contact 2002 may be coupled to and on the exposed surface of p-doped III-N crystalline layer 1904.

Returning to FIG. 17, methods 1700 continue at operation 1706, where openings are patterned and etched to expose one or more portions of an n-doped crystalline layer formed at operation 1702. The patterning and etch operations may be performed using any suitable technique or techniques. In an embodiment, a resist layer is patterned using photolithography to provide a resist mask and the underlying materials exposed by openings in the resist mask are etched to form the opening(s) to expose the one or more portions of an n-doped crystalline layer, and the resist layer is removed. Methods 1700 continue at operation 1707, where a dielectric spacer and a contact are provided to contact the n-doped crystalline layer exposed at operation 1706 while providing insulation between the contact and intervening layers. The dielectric spacer may be formed using any suitable technique or techniques such as conformal deposition techniques and the dielectric spacer may include any suitable materials such as SiO2, SiON, SiOCN, SiOC(H), SiN, SOG, BCB, etc.). Subsequent to the conformal deposition, a directional etch may be performed to remove dielectric spacer from the bottom of the opening prior to contact. The contact may be formed using any suitable technique or techniques such as deposition techniques followed by optional planarization and/or patterning techniques.

Figure 21:
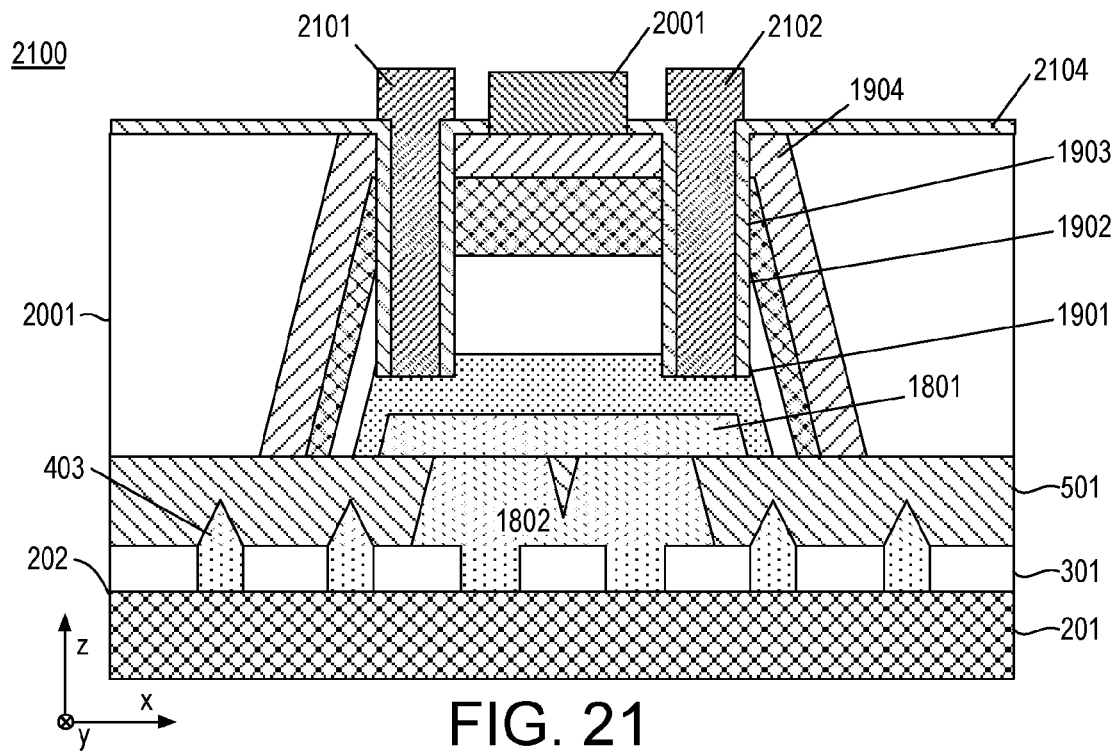

FIG. 21 illustrates an example diode device structure 2100 similar to diode device structure 2100, after the formation of openings through portions of p-doped III-N crystalline layer 1904, lightly p-doped III-N crystalline layer 1903, lightly n-doped III-N crystalline layer 1902, and n-doped III-N crystalline layer 1901 to expose regions of n-doped III-N crystalline layer 1901. In the illustrated embodiment, the openings are also through a portion of n-doped III-N crystalline layer 1901. Also as shown, the sidewalls of the openings and, optionally, the exposed top surfaces of dielectric layer 2104 and p-doped III-N crystalline layer 1904 are covered with a dielectric spacer, which may include any dielectric material of any suitable thickness. Furthermore, contacts 2101, 2102 are disposed within the openings. Contacts 2101, 2102 may be any suitable material or materials such as one or more of titanium, aluminum, and tungsten.

Diode device structure 2100 may be coupled to higher level metallization layers or other circuitry and diode device structure 2100 may provide a high breakdown diode capable of operating at 600 to 1.000 V or more. Such diode device structures may provide excellent performance in PMIC implementations, RF implementations, power converter implementations (such as power conversion for automotive applications), etc.

Figure 22:
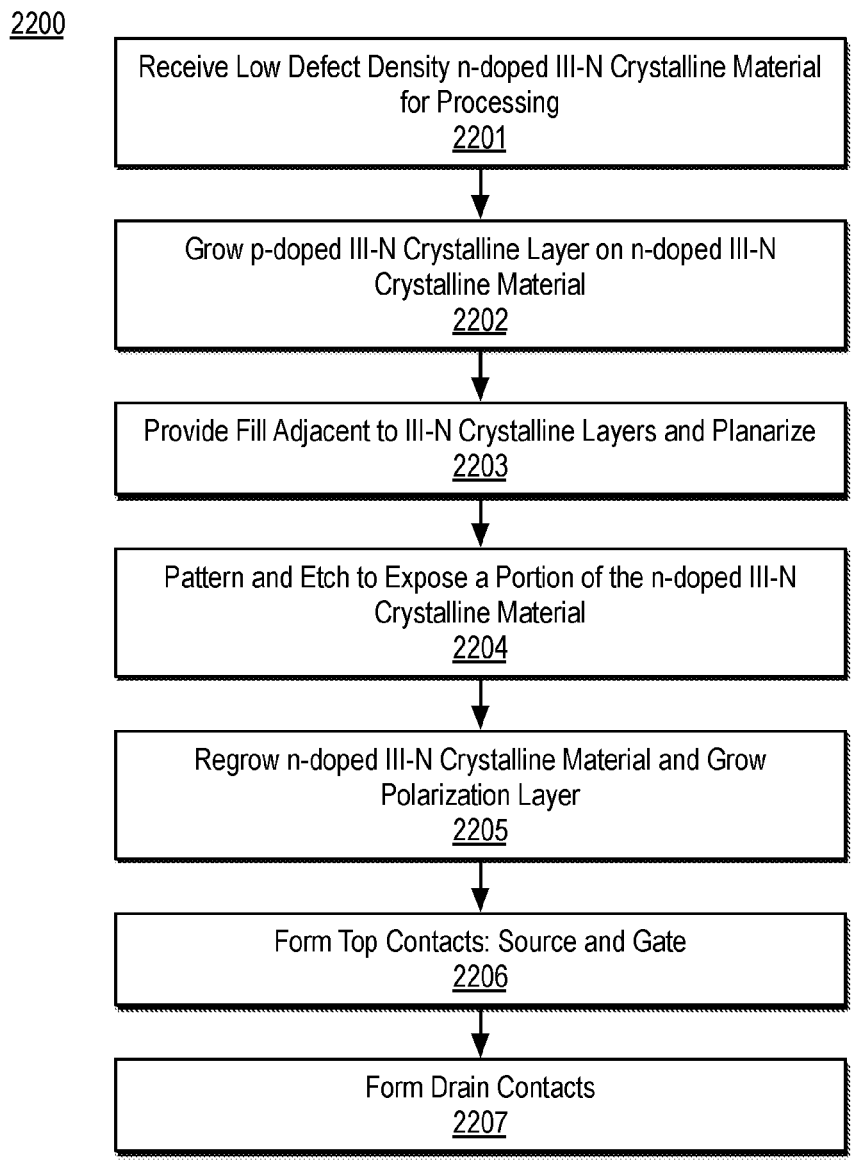
FIG. 22 is a flow diagram illustrating methods for forming transistor device structures implementing a low defect density III-N material.

FIG. 22 is a flow diagram illustrating methods 2200 for forming transistor device structures implementing a low defect density III-N material, arranged in accordance with at least some implementations of the present disclosure. FIGS. 23, 24, 25, 26, and 28 are cross-sectional views of exemplary transistor device structures as selected fabrication operations in the methods 2200 are performed, in accordance with some embodiments.

As shown in FIG. 22, methods 2200 begin at operation 2201, where a low defect density III-N crystalline material 2201 is received for processing. The low defect density film may be received for processing using any suitable technique or techniques. For example, a low defect density III-N crystalline material or film may be generated or formed using any suitable technique or techniques discussed with respect to methods 100.

Figure 23:
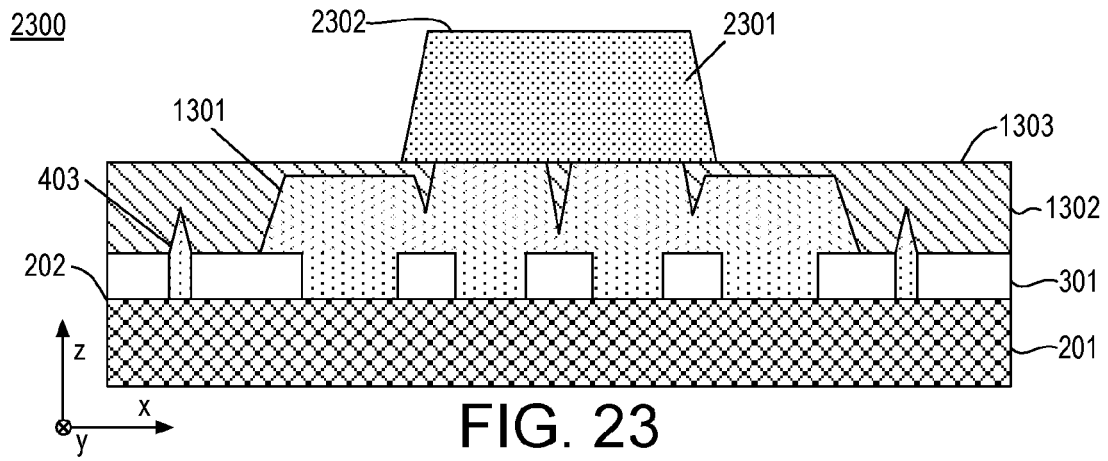
FIGS. 23, 24, 25, 26, 27, and 28 are cross-sectional views of exemplary transistor device structures as selected fabrication operations in the methods of FIG. 22 are performed.

FIG. 23 illustrates an example transistor device structure 2300 including an example III-N crystalline material 2301. Although illustrated with transistor device structure 2300, which provides a structure similar to semiconductor device structure 1300, any semiconductor device structure discussed with respect to methods 100 may be used to provide III-N crystalline material 2301 for processing. As shown in FIG. 23, III-N crystalline material 2301 may be grown from a III-N crystalline structure 1301 as discussed herein. Transistor device structure 2300 may include any materials and may have any characteristic discussed herein with respect to semiconductor device structure 1300. In an embodiment, III-N crystalline structure 1301 is an n-doped GaN crystalline material. For example, III-N crystalline structure 1301 may be epitaxial grown with an in situ n-dopant such as Si. In an embodiment, III-N crystalline structure 1301 is n-doped GaN doped with Si at a concentration in the range of $1e18/cm^3$ to $1e19/cm^3$, with higher concentrations being more advantageous (e.g., III-N crystalline material 2301 may be n-GaN doped with Si). Furthermore, in an embodiment, III-N crystalline material 2301 is a lightly n-doped. GaN crystalline material such that III-N crystalline material 2301 has a dopant concentration of not less than one order of magnitude less than the dopant concentration of III-N crystalline structure 1301. For example, III-N crystalline material 2301 may be epitaxial grown from III-N crystalline structure 1301 with an in situ n-dopant such as Si. In an embodiment. III-N crystalline material 2301 is n-doped GaN doped with Si at a concentration in the range of $1e17/cm^3$ to $1e18/cm^3$ (e.g., III-N crystalline material 2301 may be n-GaN doped with Si). III-N crystalline material 2301 may have any suitable thickness. In an embodiment, III-N crystalline material 2301 has a thickness (i.e., in the z-direction) in the range of 5 to 10 um. The techniques discussed herein with respect to methods 100 for the formation of III-N crystalline material 2301 provide a low defect density surface for the formation of a transistor device.

Returning to FIG. 22, methods 2200 continue at operation 2202, where a p-doped III-N crystalline layer is epitaxially grown from the n-doped III-N crystalline material. The p-doped III-N crystalline layer may be epitaxially grown using any suitable technique or techniques such as MOCVD, VPE, HVPE, or MBE techniques. In an embodiment, operation 2202 includes p-doped III-N crystalline GaN layer doped with Mg grown in situ with the p-doped III-N crystalline GaN layer having a Mg concentration in the range of $1e18/cm^3$ to $5e19/cm^3$ (e.g., crystalline material 2301 may be n-GaN doped with Si).

Figure 24:
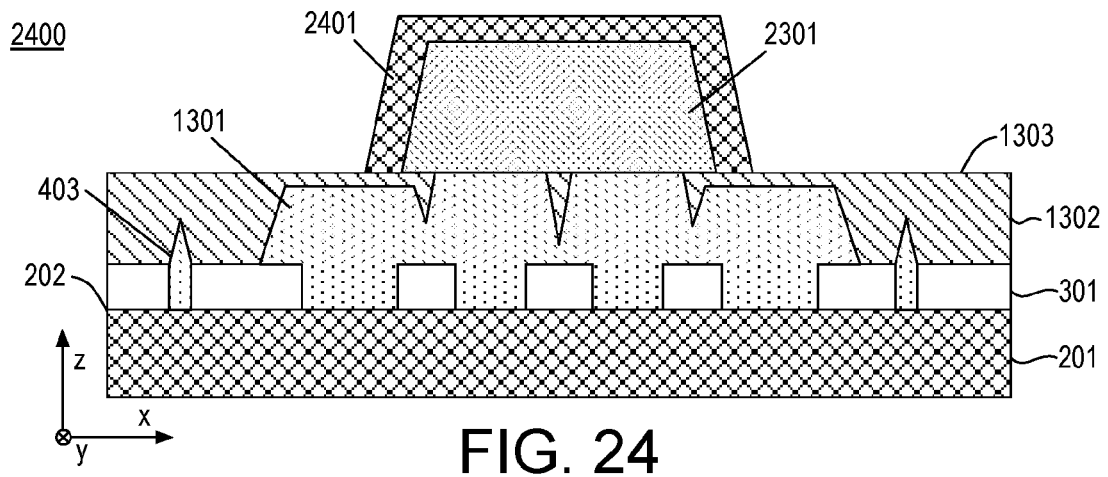

FIG. 24 illustrates an example transistor device structure 2400 similar to transistor device structure 2300, after the epitaxial growth of a p-doped crystalline layer 2401. As shown, in an embodiment, p-doped III-N crystalline layer 2401 is on and coupled to III-N crystalline material 2301. As discussed, p-doped III-N crystalline layer 2401 may include any suitable p-doped crystalline material such as p-doped GaN doped with Mg having a concentration in the range of $1e18/cm^3$ to $5e19/cm^3$.

Returning to FIG. 22, methods 2200 continue at operation 2203, where a dielectric fill material is provided adjacent to the III-N crystalline layers and the dielectric fill material is planarized to expose the top most p-doped III-N crystalline layer formed at operation 2202. For example, operation 2203 may include a gap-filling dielectric deposition process such as a flowable oxide deposition, a bulk deposition, a spin on glass operation, a BCB deposition, or the like with an electrically insulating dielectric (e.g., SiO2, SiON, SiOCN, SiOC(H), SiN, SOG, BCB, etc.). In an embodiment, a nitride deposition (PECVD) process may be employed to backfill the III-N crystal structures with an electrically insulating dielectric (e.g., SiN). Operation 2203 may then include chemical-mechanical polishing of the gap-filling dielectric, stopping on a top surface of top most p-doped III-N crystalline layer.

Methods 2200 continue at operation 2204, where openings are patterned and etched to expose a portion of the n-doped III-N crystalline material received at operation 2201 (and covered by the p-doped III-N crystalline layer formed at operation 2202). The patterning and etch operations may be performed using any suitable technique or techniques. In an embodiment, a resist layer is patterned using photolithography to provide a resist mask and the underlying materials exposed by openings in the resist mask are etched to form the opening(s) to expose the n-doped crystalline material layer, and the resist layer is removed.

Figure 25:
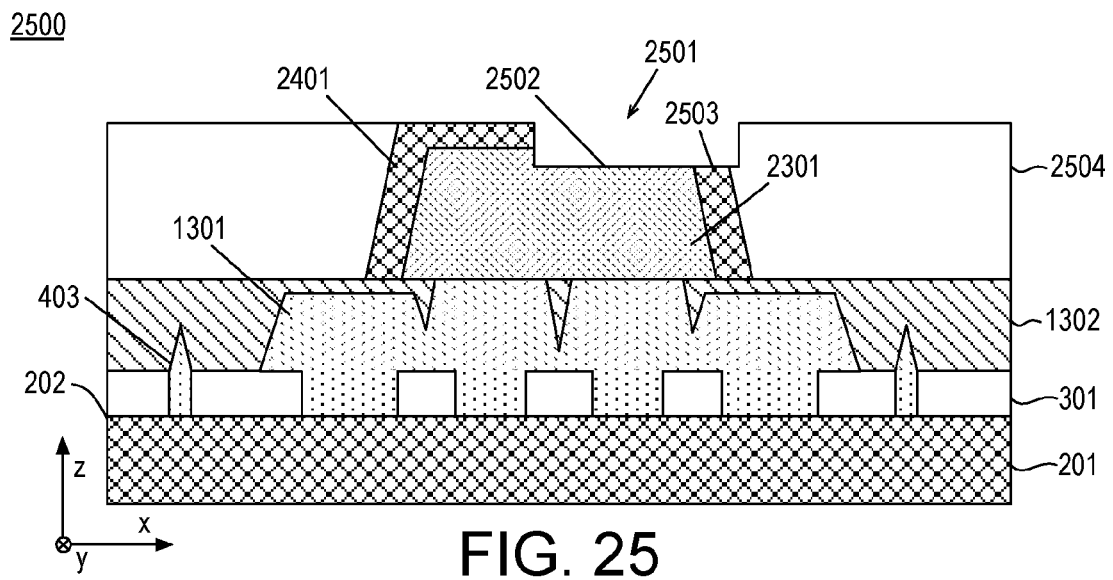

FIG. 25 illustrates an example transistor device structure 2500 similar to transistor device structure 2400 after the formation of a dielectric layer 2504 and an opening 2501 exposing a region 2502 of n-doped crystalline material 2301 and a region 2503 of p-doped III-N crystalline layer 2401. As shown, dielectric layer 2504, after planarization, is on or over previously exposed portions of dielectric layer 1302 and laterally adjacent to the material stack provided by n-doped III-N crystalline material 2301 and p-doped III-N crystalline layer 2401. Furthermore, as shown, opening 2501 provides exposes region 2502 of n-doped III-N crystalline material 2301 and region 2503 of p-doped III-N crystalline layer 2401 by providing a recess therein that removes a portion of p-doped III-N crystalline layer 2401 to expose n-doped 114-N crystalline material 2301. As shown, in some embodiments such processing also removes a portion of n-doped III-N crystalline material 2301 to provide a recess therein. In some embodiments, no recess is provided in n-doped III-N crystalline material 2301 and such that the processing to provide opening 2501 stops after removing a portion of p-doped III-N crystalline layer 2401 to expose n-doped III-N crystalline material 2301.

Returning to FIG. 22, methods 2200 continue at operation 2205, where a regrowth of n-doped III-N crystalline material is performed such that the n-doped III-N crystalline material covers the p-doped III-N crystalline layer and a polarization layer is grown on the regrown n-doped III-N crystalline material layer. The n-doped III-N crystalline layers may be epitaxially grown using any suitable technique or techniques discussed herein. In an embodiment, operation 2205 includes growing a n-doped III-N crystalline GaN layer doped with Si grown in situ with the n-doped III-N crystalline GaN layer. In an embodiment, the regrown III-N crystalline material layer is n-doped GaN doped to the same concentration as the n-doped III-N crystalline material received at operation 2201. In an embodiment, the regrown III-N crystalline material layer is n-doped GaN doped with Si at a concentration in the range of $1e17/cm^3$ to $1e18/cm^3$.

Furthermore, the polarization layer may be grown using any suitable technique or techniques such as MOCVD, VPE, HVPE, or MBE techniques. The polarization layer may include any material or material stacks that may provide a 2D electron gas (2DEG) within the n-doped III-N crystalline material. For example, the polarization layer may include AlN, AlInN, or AlGaN, or any combination thereof.

Figure 26:
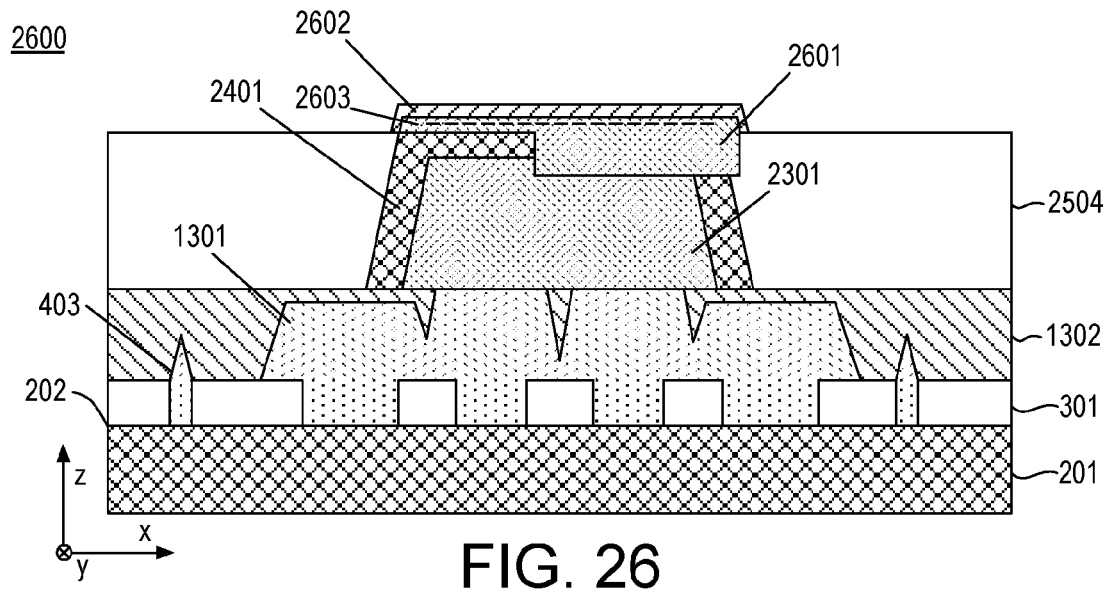

FIG. 26 illustrates an example transistor device structure 2600 similar to transistor device structure 2500 after the regrowth of an n-doped III-n crystalline material 2601 and after the growth of a polarization layer 2602, which induces a 2DEG 2603 in n-doped III-n crystalline material 2601. As discussed, n-doped III-N crystalline material 2601 may include any suitable n-doped III-N crystalline material such as GaN doped with Si. Furthermore, n-doped III-N crystalline material 2601 may have any suitable thickness (i.e., in the z-direction) such as a thickness in the range of 2 to 3 um. Polarization layer 2602 may include any suitable or stack of materials that invokes 2DEG 2603 in n-doped III-N crystalline material 2601 such as one or more of AlN, AlInN, or AlGaN. Polarization layer 2602 may have any suitable thickness (i.e., in the z-direction) such as a thickness in the range of 20 to 30 nm.

Returning to FIG. 22, methods 2200 continue at operation 2206, where top contacts, a source contact and a gate contact are formed. The top contacts may be formed using any suitable technique or techniques. In an embodiment, a gate dielectric is patterned on the polarization layer formed at operation 2205 and a gate contact or electrode is formed on a portion of the gate dielectric. Subsequently, an opening through the gate dielectric (if needed) is provided and an optional recess into the polarization layer is formed and the source contact or electrode is formed in the recess or on the polarization layer. The gate dielectric may be formed using any suitable technique or techniques such as deposition and patterning techniques. The gate contact or electrode may also be formed using any suitable technique or techniques such as deposition and patterning techniques. The opening and recess may be formed using patterning and etch operations such as resist masking and etch operations and the source contact or electrode may also be formed using any suitable technique or techniques such as deposition and patterning techniques.

Figure 27:
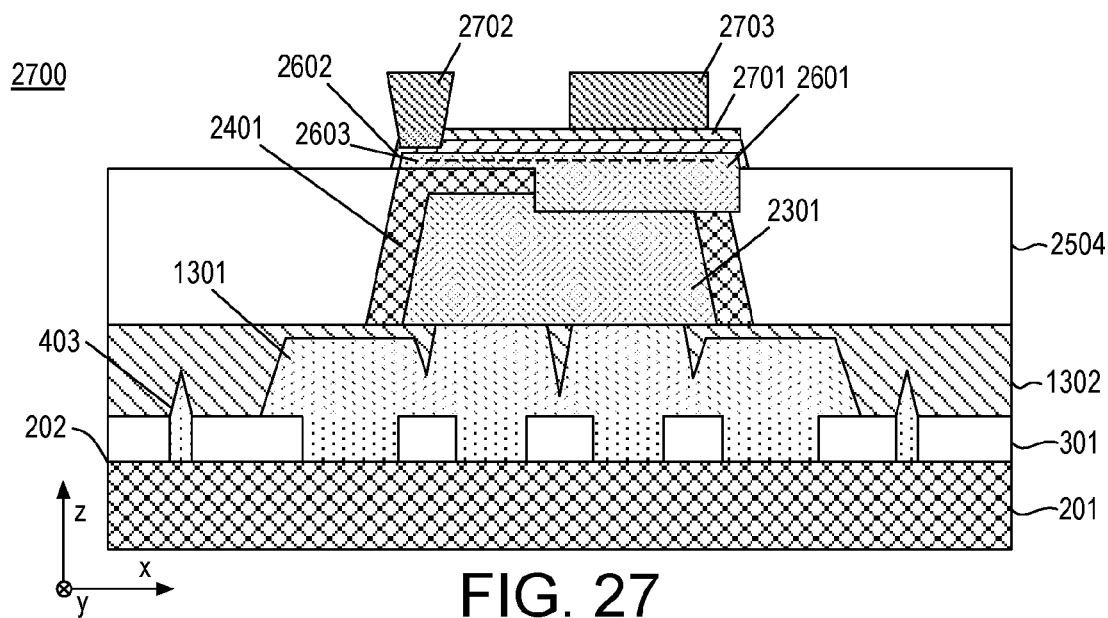

FIG. 27 illustrates an example transistor device structure 2700 similar to transistor device structure 2600 after formation of a gate dielectric 2701, a gate contact 2703, and a source contact 2702. As shown, gate dielectric 2701 may cover a portion of polarization layer 2602 and, notably, gate dielectric 2701 is at least between polarization layer 2602 and gate contact 2703. Gate contact 2703 may also be characterized as a gate electrode. Gate dielectric 2701. Gate dielectric 2701 may include any suitable material or materials such as aluminum oxide, hafnium oxide, zirconium oxide, titanium silicon oxide, hafnium silicon oxide, silicon nitride, or a stack thereof and gate dielectric 2701 may be formed using any suitable technique or techniques. In an embodiment, a gate dielectric layer is blanket deposited on the exposed portions of polarization layer 2602 and dielectric layer 2504 and portions are selectively removed to provide gate dielectric 2701 using patterning and etch techniques. Gate contact 2703 may include any suitable material or materials such as a work function layer or material of platinum, nickel, titanium nitride, or tantalum nitride and a gate cap metal such as tungsten on the work function layer and gate contact 2703 may be formed using any suitable technique or techniques. In an embodiment, a gate electrode layer is deposited by a blanket deposition process portions are selectively removed to provide gate contact 2703. Furthermore, source contact 2702 may include any suitable material or materials such as titanium, titanium nitride, tungsten, gold, or aluminum. In an embodiment, source contact 2702 includes an n+GaN on n+InGaN layer integrated therein and on polarization layer 2602 for reduced contact resistance. In an embodiment, a source contact layer is deposited by a blanket deposition process portions are selectively removed to provide source contact 2702.

Returning to FIG. 22, methods 2200 continue at operation 2207, where drain contacts are formed by creating openings in the dielectric layer formed at operation 2203 to expose a portion of the n-doped III-N crystalline material received at operation 2201 and contacts to the n-doped III-N crystalline material are made such that the contacts are insulated by the dielectric layer. For example, the openings may be formed using any suitable technique or techniques such as patterning and etch techniques. In an embodiment, a resist layer is patterned using photolithography to provide a resist mask and the underlying materials exposed by openings in the resist mask are etched to form the openings) to expose the n-doped III-N crystalline material, and the resist layer is removed. The drain contact may be formed within the opening using any suitable technique or techniques such as deposition techniques followed by optional planarization and/or patterning techniques.

Figure 28:
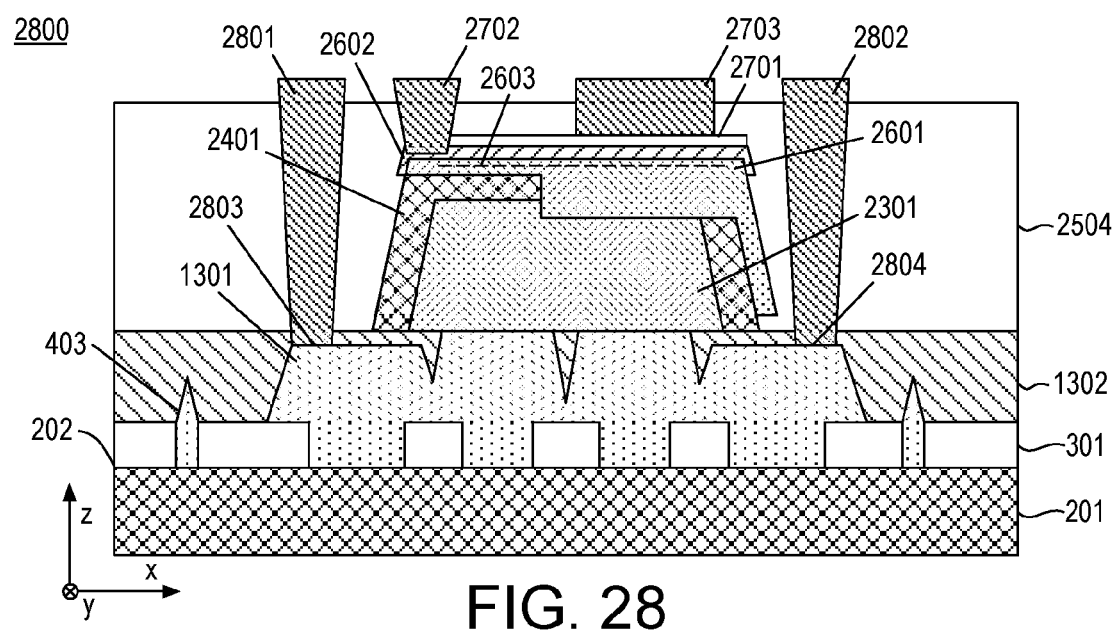

FIG. 28 illustrates an example transistor device structure 2800 similar to transistor device structure 2700, after the formation of openings through portions of dielectric layer 2504 to expose regions 2803, 2804 of n-doped III-N crystalline structure 1301 and after the formation of drain contacts 2801, 2802 to contact regions 2803, 2804, respectively. Drain contacts 2801, 2802 may include any suitable material or materials such as a titanium, titanium nitride, tungsten, gold, or aluminum, or combinations thereof and drain contacts 2801, 2802 may be formed using any suitable technique or techniques such as deposition techniques followed by planarization and/or patterning techniques. In an embodiment drain contacts 2801, 2802 include an n+GaN on n+InGaN layer integrated therein and on n-doped III-N crystalline structure 1301 for reduced contact resistance.

Transistor device structure 2800 may be coupled to higher level metallization layers or other circuitry and transistor device structure 2800 may provide a high breakdown transistor capable of operating at 600 to 1,000 V or more. Such transistor device structures may provide excellent performance in PMIC implementations, RF implementations, power converter implementations (such as power conversion for automotive applications), etc. In an embodiment, transistor device structure 2800 and diode device structure 2100 are formed on the same monolithic substrate 201 to provide an integrated circuit including transistor device structure 2800 and diode device structure 2100. In an embodiment, transistor device structure 2800 and diode device structure 2100 may be integrated onto the same substrate 201 by masking off a region of substrate 201 with an amorphous material such as a dielectric or the like, forming either or portions of transistor device structure 2800 or diode device structure 2100, removing the mask, masking off the formed transistor device structure 2800 or diode device structure 2100 or portions thereof, forming the other of transistor device structure 2800 and diode device structure 2100, and removing the second mask. The transistor device structure 2800 and diode device structure 2100 may then be coupled with higher metallization layers or other interconnects to provide an integrated circuit including transistor device structure 2800 and diode device structure 2100 on the same substrate 201.

Figure 29:
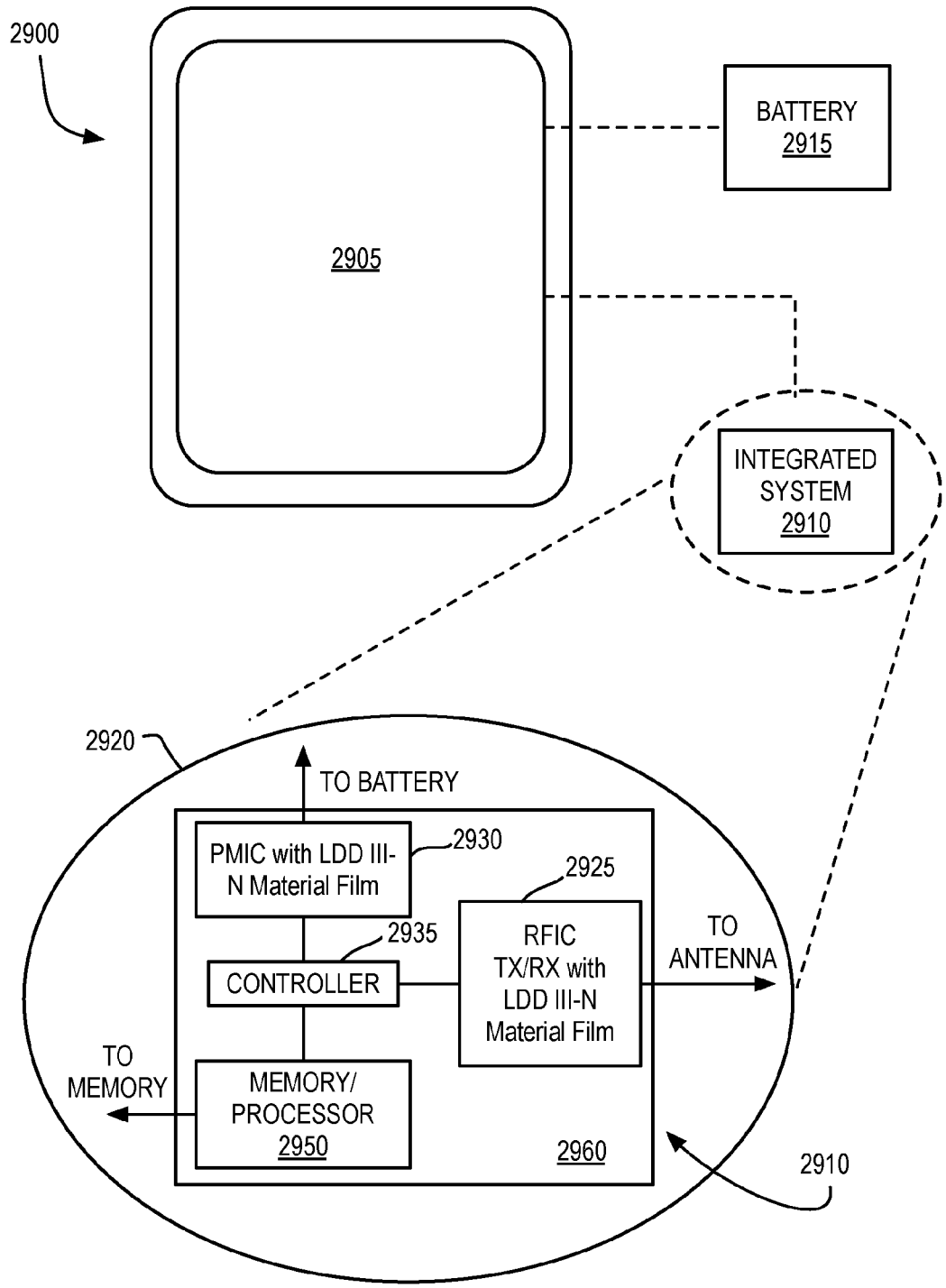
FIG. 29 is an illustrative diagram of a mobile computing platform employing an IC with transistor(s) and/or diode(s) having low density defect (LDD) III-N crystalline material films.

FIG. 29 is an illustrative diagram of a mobile computing platform 2900 employing an IC with transistor(s) and/or diode(s) having low density defect (LDD) III-N crystalline material films, arranged in accordance with at least some implementations of the present disclosure. A transistor or diode having a LDD III-N crystalline material, film, or layer implemented by mobile computing platform 2900 any transistor (or transistor structure), diode (or diode structure), or III-N crystal structure discussed herein such as diode structure 2100 or transistor device structure 2800. Mobile computing platform 2900 may be any portable device configured for each of electronic data display, electronic data processing, wireless electronic data transmission, or the like. For example, mobile computing platform 2900 may be any of a tablet, a smart phone, a netbook, a laptop computer, etc. and may include a display screen 2905, which in the exemplary embodiment is a touchscreen (e.g., capacitive, inductive, resistive, etc. touchscreen), a chip-level (SoC) or package-level integrated system 2910, and a battery 2915. Battery 2915 may include any suitable device for providing electrical power such as a device consisting of one or more electrochemical cells and electrodes to couple to an outside device.

Furthermore, although illustrated with respect to mobile computing platform 2900, the IC with transistor(s) and/or diode(s) having low density defect (LDD) III-N crystalline material films may be implemented in any suitable implementation or form factor such as an automotive application or the like. For example, diode device structure 2100 and/or transistor device structure 2800 may be implemented in a power convertor that is provided between a battery and any suitable downstream electronics. In an embodiment, diode device structure 2100 and/or transistor device structure 2800 provide high voltage breakdown devices that may operate at voltages in the range of 600 to 1,000 V or higher.

Integrated system 2910 is further illustrated in the expanded view 2920. In the exemplary embodiment, packaged device 2950 (labeled "Memory/Processor" in FIG. 29) includes at least one memory chip (e.g., RAM), and/or at least one processor chip (e.g., a microprocessor, a multi-core microprocessor, or graphics processor, or the like). In an embodiment, the package device 2950 is a microprocessor including an SRAM cache memory. Packaged device 2950 may be further coupled to (e.g., communicatively coupled to) a board, a substrate, or an interposer 2960 along with, one or more of a power management integrated circuit (PMIC) 2930, RF (wireless) integrated circuit (RFIC) 2925 including a wideband RF (wireless) transmitter and/or receiver (TX/RX) (e.g., including a digital baseband and an analog front end module further comprises a power amplifier on a transmit path and a low noise amplifier on a receive path), and a controller thereof 2935. In general, packaged device 2950 may be also be coupled to (e.g., communicatively coupled to) display screen 2905. As shown, one or both of PMIC 2930 and RFIC 2925 may employ transistor(s) and/or diode(s) having low density defect (LDD) III-N crystalline material films.

For example, an employed transistor or diode may include a first structure comprising a crystalline III-N semiconductor material over a substrate and partially within an opening of a first dielectric layer such that the first structure comprises a first portion within the opening and a second portion extending over the opening and laterally onto a region of the first dielectric layer adjacent to the opening, a second dielectric layer over the first dielectric layer and laterally adjacent to the second portion of the first structure, and a second structure comprising the crystalline III-N semiconductor material over the second portion of the first structure and extending laterally onto a region of the second dielectric layer such that the region of the second dielectric layer is over the region of the first dielectric layer. In an embodiment, an IC includes the transistor or diode such that the employed transistor or diode is integrated into a system including a battery coupled to the IC. In an embodiment, the IC includes both a transistor and a diode including low density detect (LDD) III-N crystalline material films such that the transistor and the diode are both on the same monolithic substrate.

Functionally, PMIC 2930 may perform battery power regulation, DC-to-DC conversion, etc., and so has an input coupled to battery 2915 and with an output providing a current supply to other functional modules. In an embodiment, PMIC 2930 may perform high voltage operations. As further illustrated, in the exemplary embodiment. RFIC 2925 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 2950 or within a single IC (SoC) coupled to the package substrate of the packaged device 2950.

Figure 30:
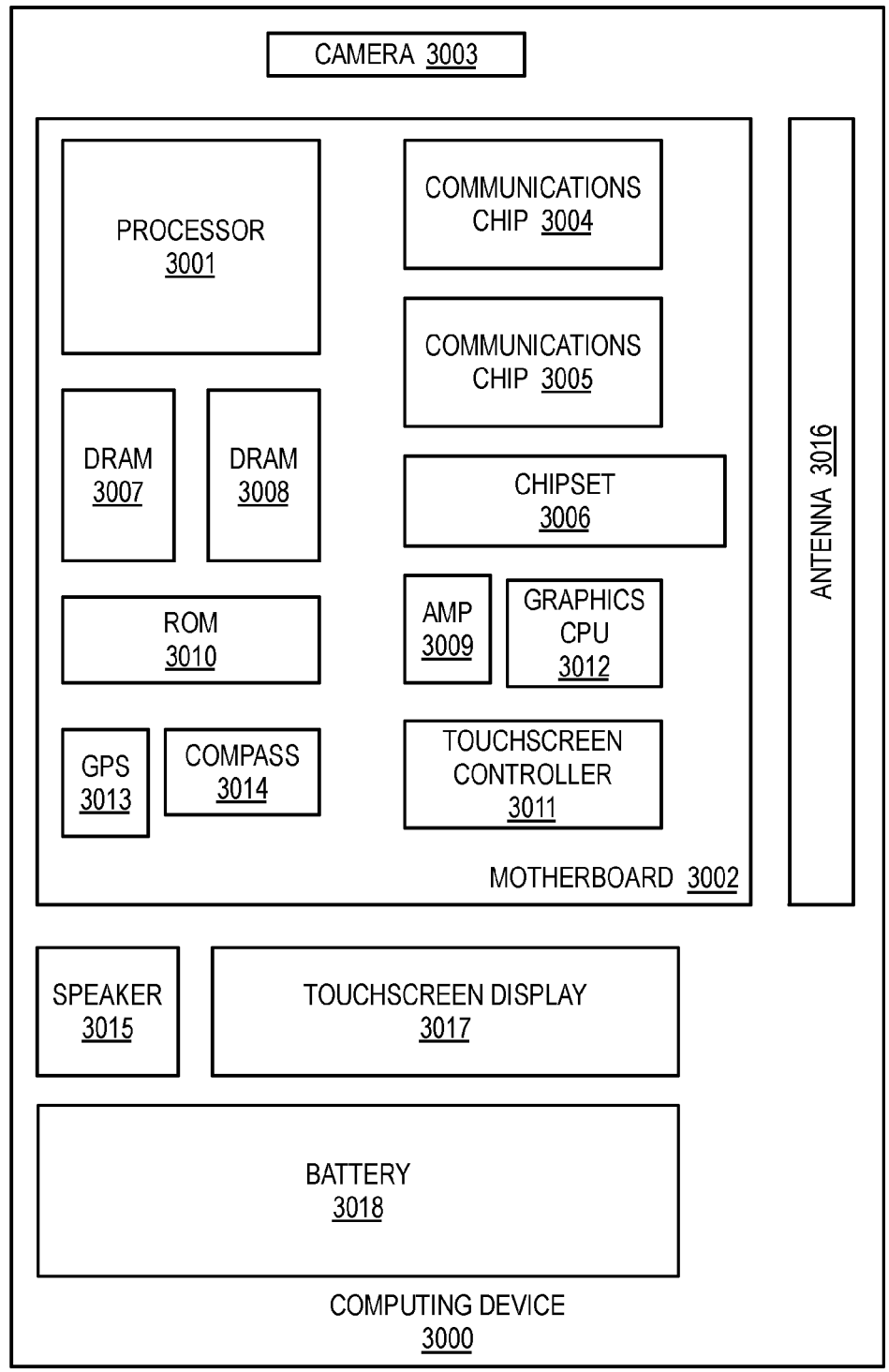
FIG. 30 is a functional block diagram of a computing device, all arranged in accordance with at least some implementations of the present disclosure.

FIG. 30 is a functional block diagram of a computing device 3000, arranged in accordance with at least some implementations of the present disclosure. Computing device 3000 may be found inside platform 2900, for example, and further includes a motherboard 3002 hosting a number of components, such as but not limited to a processor 3001 (e.g., an applications processor) and one or more communications chips 3004, 3005, Processor 3001 may be physically and/or electrically coupled to motherboard 3002. In some examples, processor 3001 includes an integrated circuit die packaged within the processor 3001. In general, the term "processor" may refer to any device or portion of a device that processes electronic data from registers and/or memory to transform that electronic data into other electronic data that may be stored in registers and/or memory. Any one or more device or component of computing device 3000 may include transistor(s) or transistor structure(s) and/or diode(s) and/or diode structure(s) having low density defect (LDD) III-N crystalline material films as discussed herein.

In various examples, one or more communication chips 3004, 3005 may also be physically and/or electrically coupled to the motherboard 3002. In further implementations, communication chips 3004 may be part of processor 3001. Depending on its applications, computing device 3000 may include other components that may or may not be physically and electrically coupled to motherboard 3002. These other components may include, but are not limited to, volatile memory (e.g., DRAM) 3007, 3008, non-volatile memory (e.g., ROM) 3010, a graphics processor 3012, flash memory, global positioning system (GPS) device 3013, compass 3014, a chipset 3006, an antenna 3016, a power amplifier 3009, a touchscreen controller 3011, a touchscreen display 3017, a speaker 3015, a camera 3003, and a battery 3018, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 3004, 3005 may enables wireless communications for the transfer of data to and from the computing device 3000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 3004, 3005 may implement any of a number of wireless standards or protocols, including but not limited to those described elsewhere herein. As discussed, computing device 3000 may include a plurality of communication chips 3004, 3005. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

In one or more first embodiments, a device structure comprises a first structure comprising a crystalline III-N material over a substrate and partially within an opening of a first dielectric layer, such that the first structure comprises a first portion within the opening and a second portion extending over the opening and laterally onto a region of the first dielectric layer adjacent to the opening, a second dielectric layer over the first dielectric layer and laterally adjacent to the second portion of the first structure, and a second structure comprising the crystalline III-N material over the second portion of the first structure and extending laterally onto a region of the second dielectric layer, such that the region of the second dielectric layer is over the region of the first dielectric layer.

In one or more second embodiments, further to the first embodiments, the device structure further comprises a third structure comprising the crystalline III-N material on the substrate and partially within a second opening of the first dielectric layer, such that the third structure comprises a third portion within the second opening and a fourth portion extending over the second opening and laterally onto a second region of the first dielectric layer adjacent to the second opening, such that the second structure is over the fourth portion of the third structure and extends laterally onto a second region of the second dielectric layer, such that the second region of the second dielectric layer is over the second region of the first dielectric layer.

In one or more third embodiments, further to the first or second embodiments, the second portion of the first structure and the fourth portion of the third structure are separated laterally by a portion of the second dielectric layer.

In one or more fourth embodiments, further to any of the first through third embodiments, the device structure further comprises an intervening layer between the first structure and the second structure, the intervening layer comprising an amorphous material or a crystalline material having a lattice constant mismatch with respect to the crystalline III-N material.

In one or more fifth embodiments, further to any of the first through fourth embodiments, the intervening layer comprises at least one of aluminum nitride, silicon nitride, or gallium nitride.

In one or more sixth embodiments, further to any of the first through fifth embodiments, the substrate comprises a crystalline group IV material, the opening has a longitudinal length extending along a <110> direction of a (111) plane of the crystalline group IV material that is greater than a lateral width of the opening, and the second structure has a sloped sidewall along the longitudinal length of the opening that slopes from an outer edge of the region of the second dielectric layer at a base of the second structure inwardly toward a top of the second structure.

In one or more seventh embodiments, further to any of the first through sixth embodiments, the substrate comprises a crystalline group IV material, the opening has a longitudinal length extending along a <11-2> direction of a (111) plane of the crystalline group IV material that is greater than a lateral width of the opening, and the second structure has a sidewall substantially orthogonal to a surface of the substrate.

In one or more eighth embodiments, further to any of the first through seventh embodiments, the device structure further comprises a device formed entirely on and/or within a first region of the second structure, such that the first region is over the region of the dielectric layer.

In one or more ninth embodiments, further to any of the first through eighth embodiments, the device structure further comprises a dummy structure comprising the crystalline III-N material partially within a third opening of first dielectric layer, the dummy structure having a lateral width within the third opening that is less than a lateral width of the first portion within the opening.

In one or more tenth embodiments, further to any of the first through ninth embodiments, the first structure further comprises a third portion within a second opening of the first dielectric layer and a fourth portion extending over the second opening and laterally onto a second region of the first dielectric layer adjacent to the second opening, such that the second portion and the fourth portion are merged and the fourth portion is covered by the second dielectric layer.

In one or more eleventh embodiments, further to any of the first through tenth embodiments, the crystalline III-N material comprises gallium nitride.

In one or more twelfth embodiments, further to any of the first through eleventh embodiments, the second structure comprises a low defect region opposite the substrate having a defect density of not more than 1e8 defects/cm$^2$.

In one or more thirteenth embodiments, a system includes a battery and an integrated circuit coupled to the battery, the integrated circuit including a device structure according to any of the first through twelfth embodiments and a device formed on and/or within a surface of the second structure opposite the substrate.

In one or more fourteenth embodiments, further to the thirteenth embodiments, the crystalline III-N material comprises gallium nitride (GaN) and the device comprises a first layer over the surface of the second structure, the first layer comprising a crystalline n-doped GaN material, a second layer over the first layer, the second layer comprising a crystalline p-doped GaN material, and a first contact coupled to the first layer and a second contact coupled to the second layer.

In one or more fifteenth embodiments, further to the thirteenth embodiments, the crystalline III-N material comprises n-doped gallium nitride (GaN) and the device comprises a first layer comprising the crystalline III-N material over the second structure, a second layer comprising a crystalline p-doped GaN material between a portion of the second structure and a portion of the first layer, a polarization layer on the second layer, and a gate and a source coupled to the polarization layer.

In one or more sixteenth embodiments, a system includes a means for providing electrical power and a means for converting the electrical power, the means for converting including a device structure according to any of the first through twelfth embodiments and a device formed on and/or within a surface of the second structure opposite the substrate.

In one or more seventeenth embodiments, further to the sixteenth embodiments, the crystalline III-N material comprises gallium nitride (GaN) and the device comprises a first layer over the surface of the second structure, the first layer comprising a crystalline n-doped GaN material, a second layer over the first layer, the second layer comprising a crystalline p-doped GaN material, and a first contact coupled to the first layer and a second contact coupled to the second layer.

In one or more eighteenth embodiments, further to the sixteenth embodiments, the crystalline III-N material comprises n-doped gallium nitride (GaN) and the device comprises a first layer comprising the crystalline III-N material over the second structure, a second layer comprising a crystalline p-doped GaN material between a portion of the second structure and a portion of the first layer, a polarization layer on the second layer, and a gate and a source coupled to the polarization layer.

In one or more nineteenth embodiments, a system comprises a battery and an integrated circuit coupled to the battery, the integrated circuit including a device structure comprising a first structure comprising a crystalline III-N material over a substrate and partially within an opening of a first dielectric layer, such that the first structure comprises a first portion within the opening and a second portion extending over the opening and laterally onto a region of the first dielectric layer adjacent to the opening, a second dielectric layer over the first dielectric layer and laterally adjacent to the second portion of the first structure, a second structure comprising the crystalline III-N material over the second portion of the first structure and extending laterally onto a region of the second dielectric layer, such that the region of the second dielectric layer is over the region of the first dielectric layer, and a device formed on and/or within a surface of the second structure opposite the substrate.

In one or more twentieth embodiments, further to the nineteenth embodiments, the crystalline III-N material comprises gallium nitride (GaN) and the device comprises a first layer over the surface of the second structure, the first layer comprising a crystalline n-doped GaN material, a second layer over the first layer, the second layer comprising a crystalline p-doped GaN material, and a first contact coupled to the first layer and a second contact coupled to the second layer.

In one or more twenty-first embodiments, further to the nineteenth or twentieth embodiments, the system further comprises a third layer between the first and second layers comprising a second crystalline n-doped GaN material having a dopant concentration less than the first layer and a fourth layer between the third layer and the second layer comprising a second crystalline p-doped GaN material having a dopant concentration less than the second layer.

In one or more twenty-second embodiments, further to any of the nineteenth through twenty-first embodiments, the crystalline III-N material comprises n-doped gallium nitride (GaN) and the device comprises a first layer comprising the crystalline III-N material over the second structure, a second layer comprising a crystalline p-doped GaN material between a portion of the second structure and a portion of the first layer, a polarization layer on the second layer, and a gate and a source coupled to the polarization layer.

In one or more twenty-third embodiments, further to any of the nineteenth through twenty-second embodiments, the first structure further comprises a third portion within a second opening of the first dielectric layer and a fourth portion extending over the second opening and laterally onto a second region of the first dielectric layer adjacent to the second opening, such that the second portion and the fourth portion are merged and the fourth portion is covered by the second dielectric layer, and the device further comprises a drain coupled to the fourth portion of the first structure.

In one or more twenty-fourth embodiments, further to any of the nineteenth through twenty-third embodiments, the device structure further comprises a third structure comprising the crystalline III-N material on the substrate and partially within a second opening of the first dielectric layer, such that the third structure comprises a third portion within the second opening and a fourth portion extending over the second opening and laterally onto a second region of the first dielectric layer adjacent to the second opening, such that the second structure is over the fourth portion of the third structure and extends laterally onto a second region of the second dielectric layer, such that the second region of the second dielectric layer is over the second region of the first dielectric layer.

In one or more twenty-fifth embodiments, further to any of the nineteenth through twenty-fourth embodiments, the device structure further comprises an intervening layer between the first structure and the second structure, the intervening layer comprising an amorphous material or a crystalline material having a lattice constant mismatch with respect to the crystalline III-N material.

In one or more twenty-sixth embodiments, a method of fabricating a device structure comprises epitaxially growing a first structure comprising a crystalline ill-N material over a substrate and partially within an opening of a first dielectric layer, such that the first structure comprises a first portion within the opening and a second portion extending over the opening and laterally onto a region of the first dielectric layer adjacent to the opening, forming a second dielectric layer over the first dielectric layer and laterally adjacent to the second portion of the first structure, and epitaxially growing a second structure comprising the crystalline III-N material over the second portion of the first structure and extending laterally onto a region of the second dielectric layer, such that the region of the second dielectric layer is over the region of the first dielectric layer.

In one or more twenty-seventh embodiments, further to the twenty-sixth embodiments, said epitaxially growing the first structure further comprises epitaxially growing a third structure comprising the crystalline III-N material on the substrate and partially within a second opening of the first dielectric layer, such that the third structure comprises a third portion within the second opening and a fourth portion extending over the second opening and laterally onto a second region of the first dielectric layer adjacent to the second opening, such that said epitaxially growing the second structure comprises epitaxially growing the second structure over the fourth portion of the third structure and extending laterally onto a second region of the second dielectric layer, such that the second region of the second dielectric layer is over the second region of the first dielectric layer.

In one or more twenty-eighth embodiments, further to the twenty-sixth or twenty-seventh embodiments, the method further comprises forming, prior to said epitaxially growing the second structure, an intervening layer on the first structure, the intervening layer comprising an amorphous material or a crystalline material having a lattice constant mismatch with respect to the crystalline III-N material.

In one or more twenty-ninth embodiments, further to any of the twenty-sixth through twenty-eighth embodiments, said forming the intervening layer comprises forming islands of silicon nitride and said epitaxially growing the second structure comprises epitaxially growing the second structure from exposed portions of the second portion of the first structure.

In one or more thirtieth embodiments, further to any of the twenty-sixth through twenty-ninth embodiments, the substrate comprises a crystalline group IV material, the opening has a longitudinal length extending along a <110> direction of a (111) plane of the crystalline group IV material that is greater than a lateral width of the opening, and the second structure has a sloped sidewall along the longitudinal length of the opening that slopes from an outer edge of the region of the second dielectric layer at a base of the second structure inwardly toward a top of the second structure.

In one or more thirty-first embodiments, further to any of the twenty-sixth through thirtieth embodiments, the substrate comprises a crystalline group IV material, the opening has a longitudinal length extending along a <11-2> direction of a (111) plane of the crystalline group IV material that is greater than a lateral width of the opening, and the second structure has a sidewall substantially orthogonal to a surface of the substrate.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A device structure, comprising:
    a first structure comprising a first crystalline III-N material over a substrate and partially within an opening of a first dielectric layer, wherein the first structure comprises a first portion within the opening and a second portion over the opening and extending laterally onto a region of the first dielectric layer adjacent to the opening;
    a second dielectric layer over the first dielectric layer and laterally adjacent to the second portion of the first structure, the second dielectric layer having a top surface substantially planar with a top surface of the second portion of the first structure; and
    a second structure comprising the first or a second crystalline III-N material over the second portion of the first structure and extending laterally onto a region of the second dielectric layer, wherein the region of the second dielectric layer is over the region of the first dielectric layer.

2. The device structure of claim 1, further comprising:
    a third structure comprising the crystalline III-N material on the substrate and partially within a second opening of the first dielectric layer, wherein the third structure comprises a third portion within the second opening and a fourth portion over the second opening and extending laterally onto a second region of the first dielectric layer adjacent to the second opening, wherein the second structure is over the fourth portion of the third structure and extends laterally onto a second region of the second dielectric layer, wherein the second region of the second dielectric layer is over the second region of the first dielectric layer and wherein the second portion of the first structure and the fourth portion of the third structure are separated laterally by a portion of the second dielectric layer.

3. The device structure of claim 1, further comprising:
    an intervening layer between the first structure and the second structure, the intervening layer comprising an amorphous material or a crystalline material having a lattice constant mismatch with respect to the crystalline III-N material.

4. The device structure of claim 1, wherein the substrate comprises a crystalline group IV material, the opening has a longitudinal length extending along a <110> direction of a (111) plane of the crystalline group IV material that is greater than a lateral width of the opening, and the second structure has a sloped sidewall along the longitudinal length of the opening that slopes from an outer edge of the region of the second dielectric layer at a base of the second structure inwardly toward a top of the second structure.

5. The device structure of claim 1, wherein the substrate comprises a crystalline group IV material, the opening has a longitudinal length extending along a <11-2> direction of a (111) plane of the crystalline group IV material that is greater than a lateral width of the opening, and the second structure has a sidewall substantially orthogonal to a surface of the substrate.

6. The device structure of claim 5, further comprising:
    a device entirely on and/or within a first region of the second structure, wherein the first region is over the region of the first dielectric layer.

7. The device structure of claim 1, wherein the first structure further comprises a third portion within a second opening of the first dielectric layer and a fourth portion over the second opening and extending laterally onto a second region of the first dielectric layer adjacent to the second opening, wherein the second portion and the fourth portion are merged and the fourth portion is covered by the second dielectric layer.

8. The device structure of claim 1, wherein the crystalline III-N material comprises gallium and nitrogen.

9. The device structure of claim 1, wherein the second structure comprises a low defect region opposite the substrate having a defect density of not more than 1e8 defects/cm$^2$.

10. A system comprising:
a battery; and
an integrated circuit coupled to the battery, the integrated circuit comprising a device structure comprising:
a first structure comprising a first crystalline III-N material over a substrate and partially within an opening of a first dielectric layer, wherein the first structure comprises a first portion within the opening and a second portion over the opening and extending laterally onto a region of the first dielectric layer adjacent to the opening;
a second dielectric layer over the first dielectric layer and laterally adjacent to the second portion of the first structure, the second dielectric layer having a top surface substantially planar with a top surface of the second portion of the first structure;
a second structure comprising the first or a second crystalline III-N material over the second portion of the first structure and extending laterally onto a region of the second dielectric layer, wherein the region of the second dielectric layer is over the region of the first dielectric layer; and
a device on and/or within a surface of the second structure opposite the substrate.

11. The system of claim 10, wherein the crystalline III-N material comprises gallium nitride (GaN) and the device comprises:
a first layer over the surface of the second structure, the first layer comprising a crystalline n-doped GaN material;
a second layer over the first layer, the second layer comprising a crystalline p-doped GaN material; and
a first contact coupled to the first layer and a second contact coupled to the second layer.

12. The system of claim 11, further comprising:
a third layer between the first and second layers comprising a second crystalline n-doped GaN material having a dopant concentration less than the first layer; and
a fourth layer between the third layer and the second layer comprising a second crystalline p-doped GaN material having a dopant concentration less than the second layer.

13. The system of claim 10, wherein the crystalline III-N material comprises n-doped gallium nitride (GaN) and the device comprises:
a first layer comprising the crystalline III-N material over the second structure;
a second layer comprising a crystalline p-doped GaN material between a portion of the second structure and a portion of the first layer;
a polarization layer on the second layer; and
a gate and a source coupled to the polarization layer.

14. The system of claim 13, wherein the first structure further comprises a third portion within a second opening of the first dielectric layer and a fourth portion over the second opening and extending laterally onto a second region of the first dielectric layer adjacent to the second opening, wherein the second portion and the fourth portion are merged and the fourth portion is covered by the second dielectric layer, the device further comprising:
a drain coupled to the fourth portion of the first structure.

15. A device structure, comprising:
a first structure comprising a first crystalline III-N material over a substrate and partially within an opening of a first dielectric layer, wherein the first structure comprises a first portion within the opening and a second portion over the opening and extending laterally onto a first region of the first dielectric layer adjacent to the opening;
a second dielectric layer over the first dielectric layer and laterally adjacent to the second portion of the first structure; and
a second structure comprising the first or a second crystalline III-N material over the second portion of the first structure and extending laterally onto a portion of the second dielectric layer, wherein the portion of the second dielectric layer extends along a sidewall of the second portion of the first structure and onto a second region of the first dielectric layer adjacent to the first region of the first dielectric layer.

16. The device structure of claim 15, wherein the substrate comprises a crystalline group IV material, the opening has a longitudinal length extending along a <110> direction of a (111) plane of the crystalline group IV material that is greater than a lateral width of the opening, and the second structure has a sloped sidewall along the longitudinal length of the opening that slopes from an outer edge of the portion of the second dielectric layer at a base of the second structure inwardly toward a top of the second structure.

17. The device structure of claim 15, wherein the substrate comprises a crystalline group IV material, the opening has a longitudinal length extending along a <11-2> direction of a (111) plane of the crystalline group IV material that is greater than a lateral width of the opening, and the second structure has a sidewall substantially orthogonal to a surface of the substrate.

18. The device structure of claim 15, further comprising:
a device entirely on and/or within a first region of the second structure, wherein the first region is over the first region of the first dielectric layer.

19. The device structure of claim 15, wherein the crystalline III-N material comprises gallium and nitrogen.

* * * * *